(12) United States Patent
Osada et al.

(10) Patent No.: US 11,074,954 B2
(45) Date of Patent: Jul. 27, 2021

(54) MEMORY DEVICE

(71) Applicant: TOSHIBA MEMORY CORPORATION, Tokyo (JP)

(72) Inventors: Yoshiaki Osada, Tokyo (JP); Kosuke Hatsuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 58 days.

(21) Appl. No.: 16/566,396

(22) Filed: Sep. 10, 2019

(65) Prior Publication Data

US 2020/0302989 A1    Sep. 24, 2020

(30) Foreign Application Priority Data

Mar. 22, 2019  (JP) .............................. JP2019-054203

(51) Int. Cl.
*G11C 11/16*    (2006.01)

(52) U.S. Cl.
CPC ........ *G11C 11/1675* (2013.01); *G11C 11/161* (2013.01); *G11C 11/1697* (2013.01); *G11C 11/1659* (2013.01)

(58) Field of Classification Search
CPC .................................................. G11C 11/161
USPC ....................................................... 365/158
See application file for complete search history.

(56) References Cited

U.S. PATENT DOCUMENTS

| 7,443,710 B2 | 10/2008 | Fang et al. |
| 8,723,557 B2* | 5/2014 | Ong ................. G11C 8/14 327/108 |
| 9,183,932 B1* | 11/2015 | Kwon ............... G11C 11/1673 |
| 9,570,137 B2 | 2/2017 | Sugiyama et al. |
| 9,583,171 B2 | 2/2017 | Kim et al. |
| 9,659,647 B1 | 5/2017 | Lee et al. |
| 2016/0276010 A1 | 9/2016 | Takaya et al. |
| 2018/0144782 A1* | 5/2018 | Noguchi ............. H01L 27/228 |
| 2018/0277743 A1* | 9/2018 | Inaba ................. H01L 27/228 |

FOREIGN PATENT DOCUMENTS

JP      2016177853 A      10/2016

* cited by examiner

*Primary Examiner* — Muna A Techane
(74) *Attorney, Agent, or Firm* — Holtz, Holtz & Volek PC

(57) ABSTRACT

According to one embodiment, a memory device includes: a first and a second interconnects; a memory cell including a variable resistive element, the memory cell between the first and second interconnects; and a write circuit including a current source circuit and a voltage source circuit, the write circuit writing data to the memory cell by using a write pulse. The write circuit supplies the write pulse to the memory cell by using the current source circuit in a first period from a first time of a start of supply of the write pulse to a second time, and supplies the write pulse to the memory cell by using the voltage source circuit in a second period from a third time to a fourth time of an end of the supply of the write pulse.

18 Claims, 24 Drawing Sheets

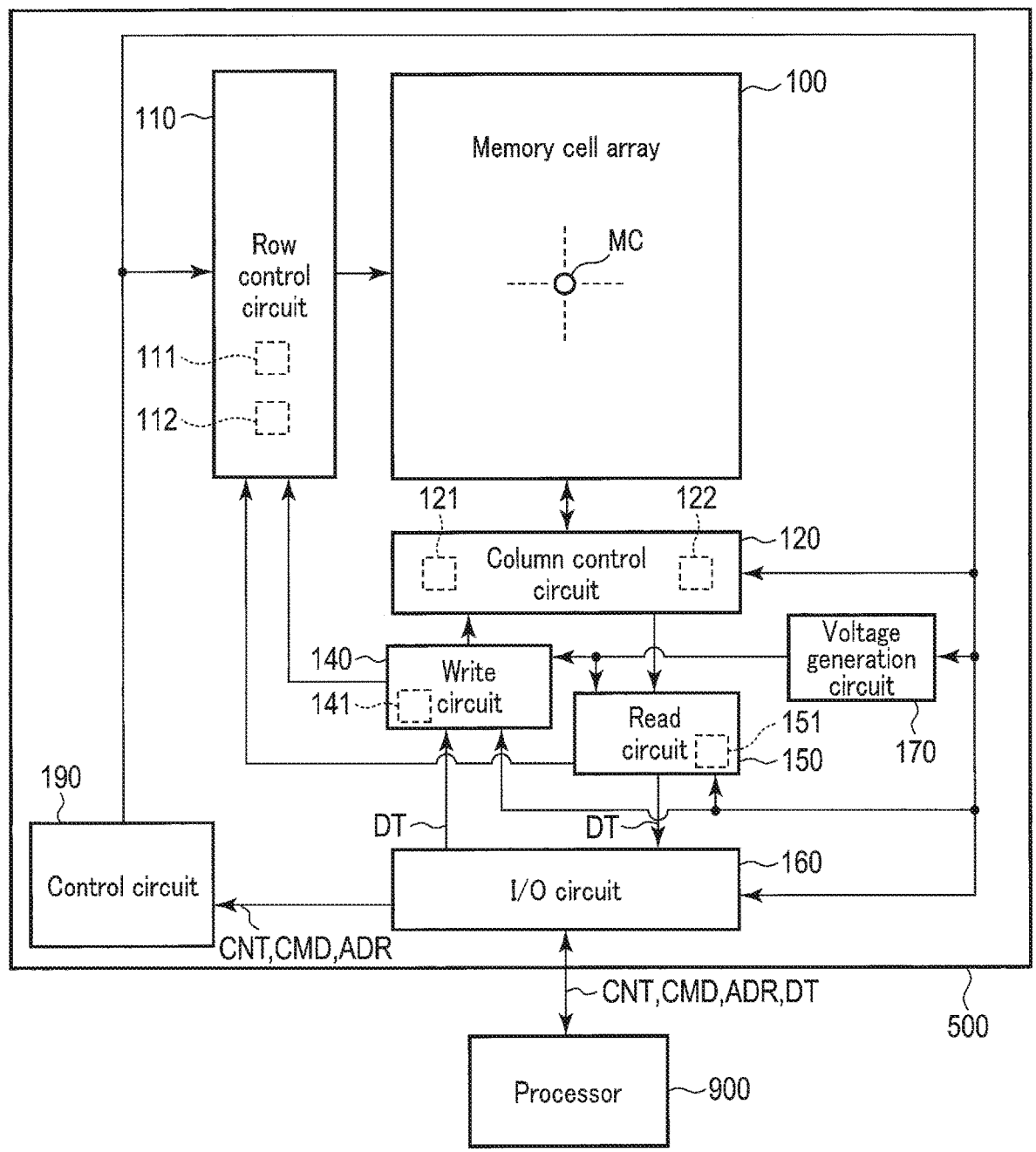
F I G. 1

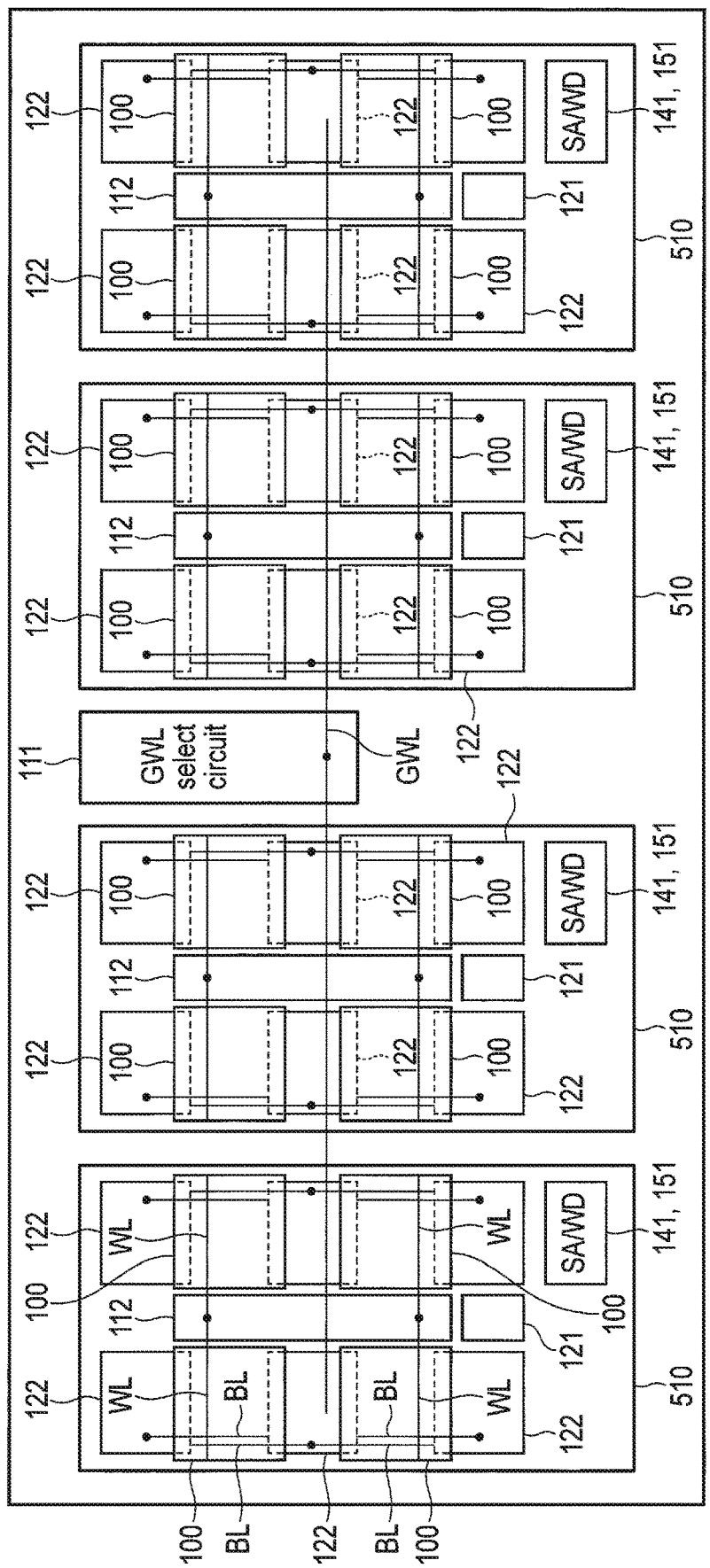
F I G. 5

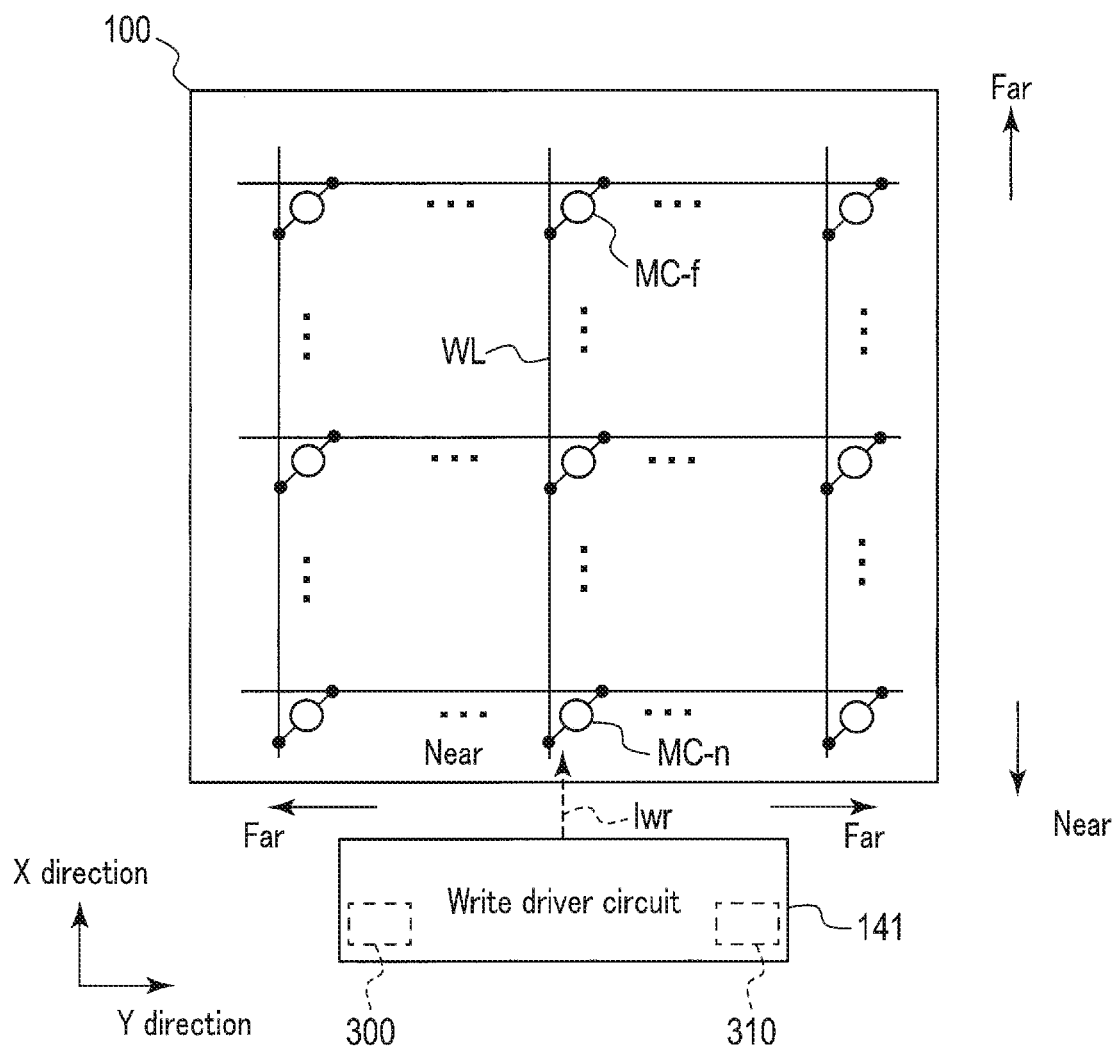
F I G. 6

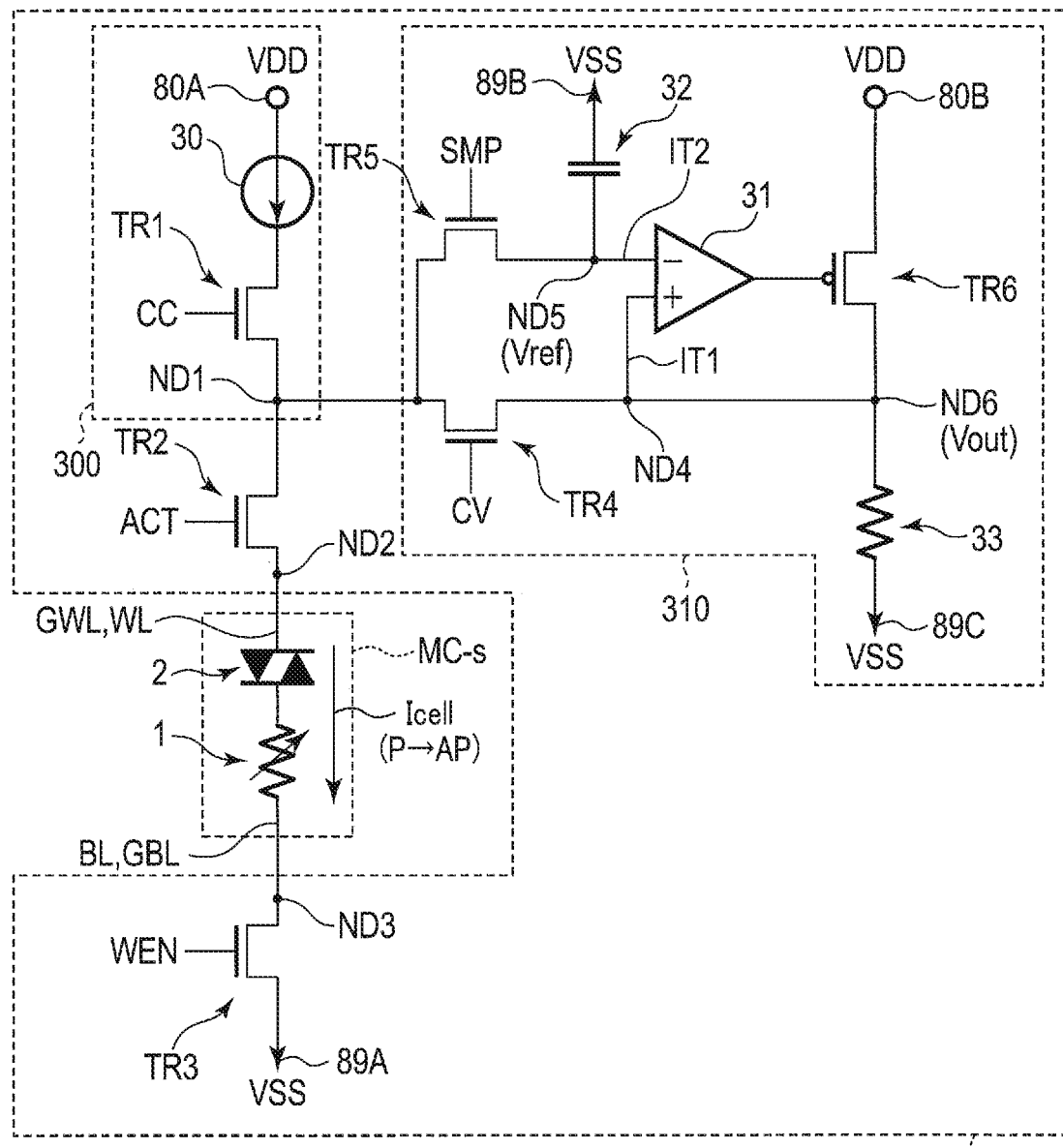
F I G. 7

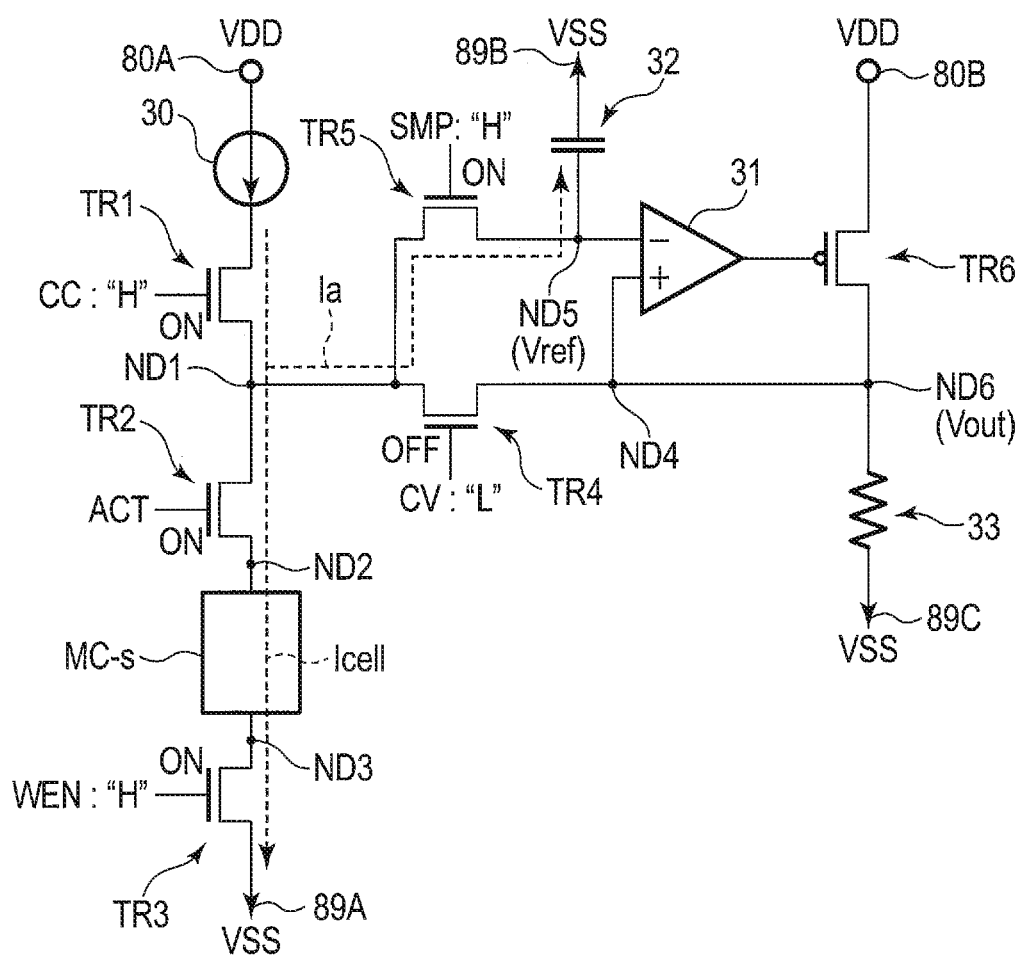
F I G. 10

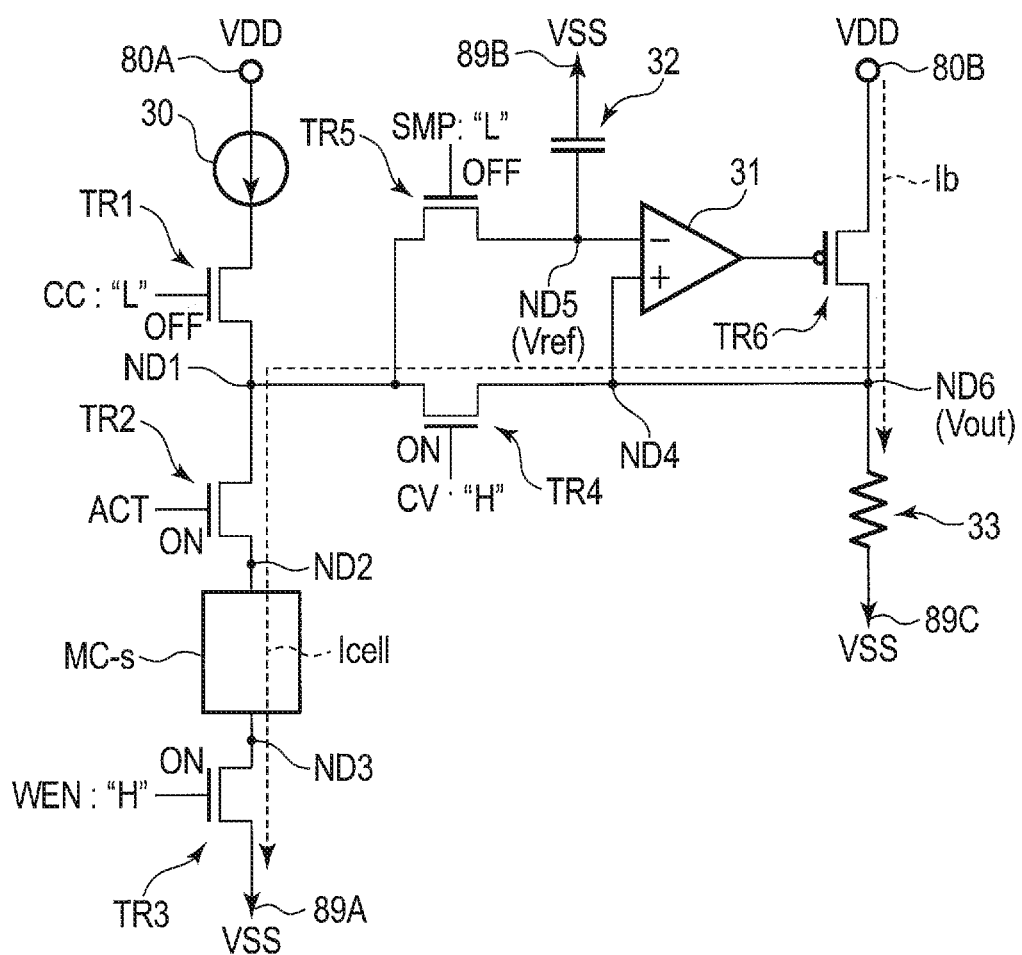
F I G. 12

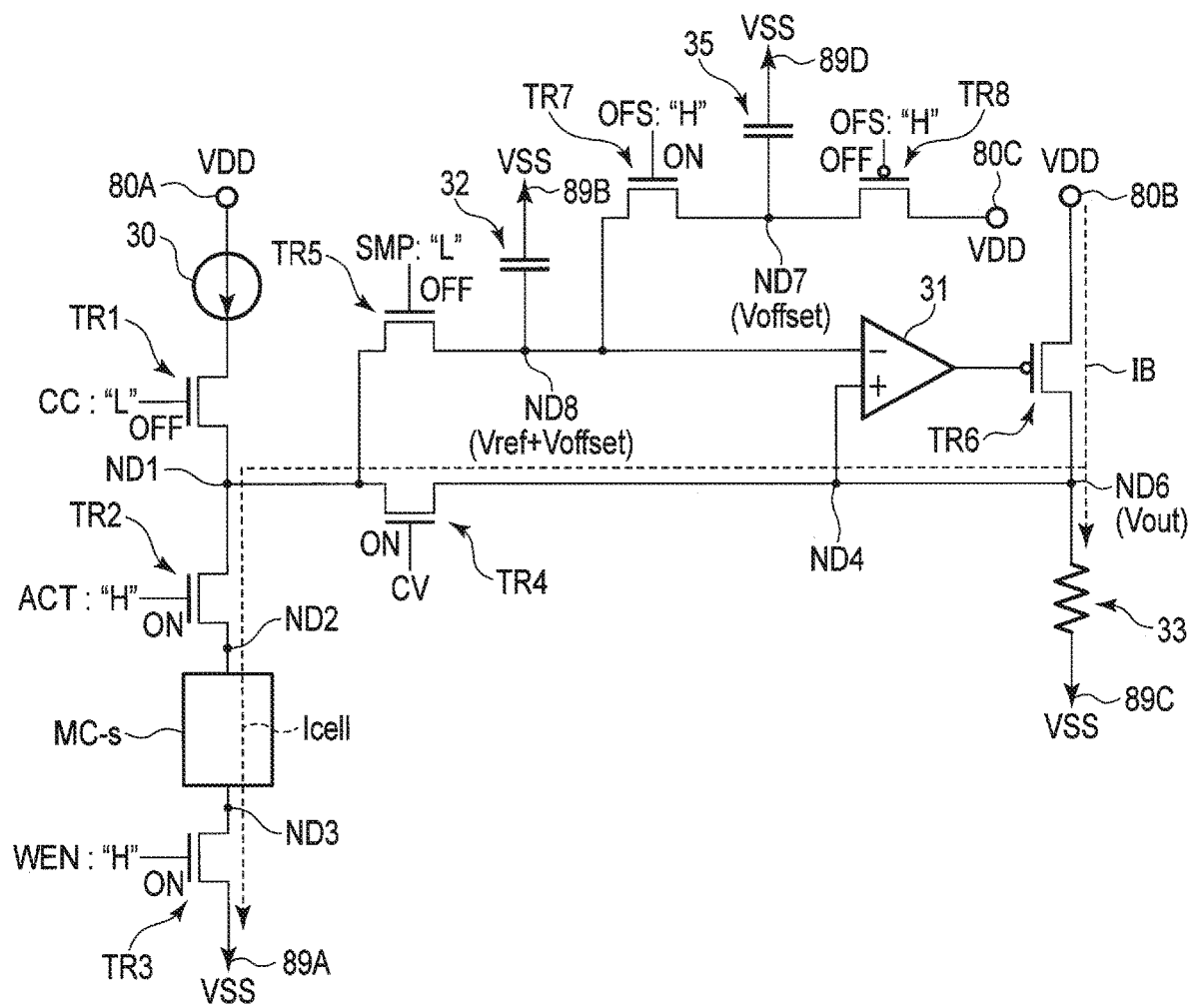
F I G. 17

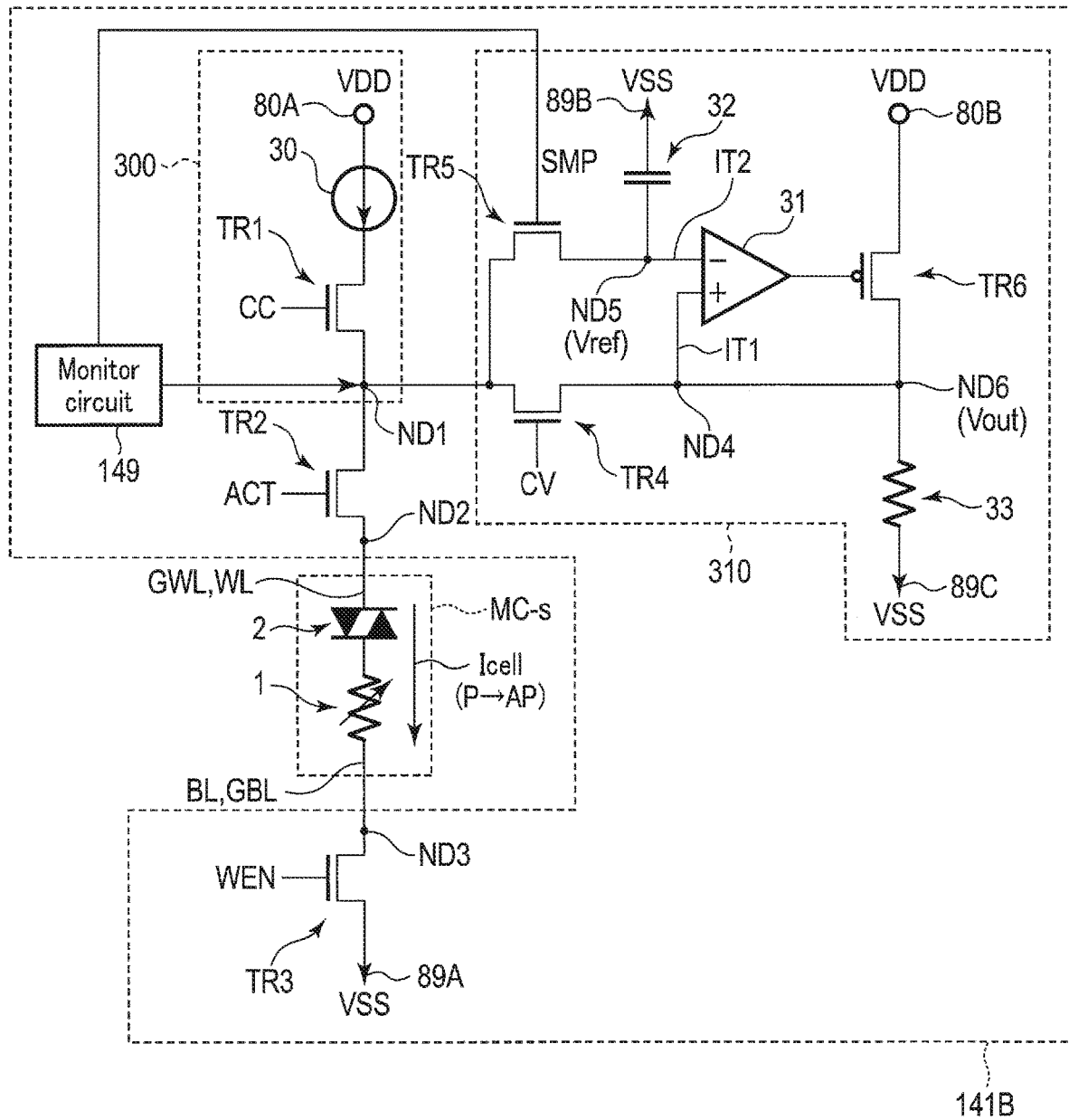
F I G. 18

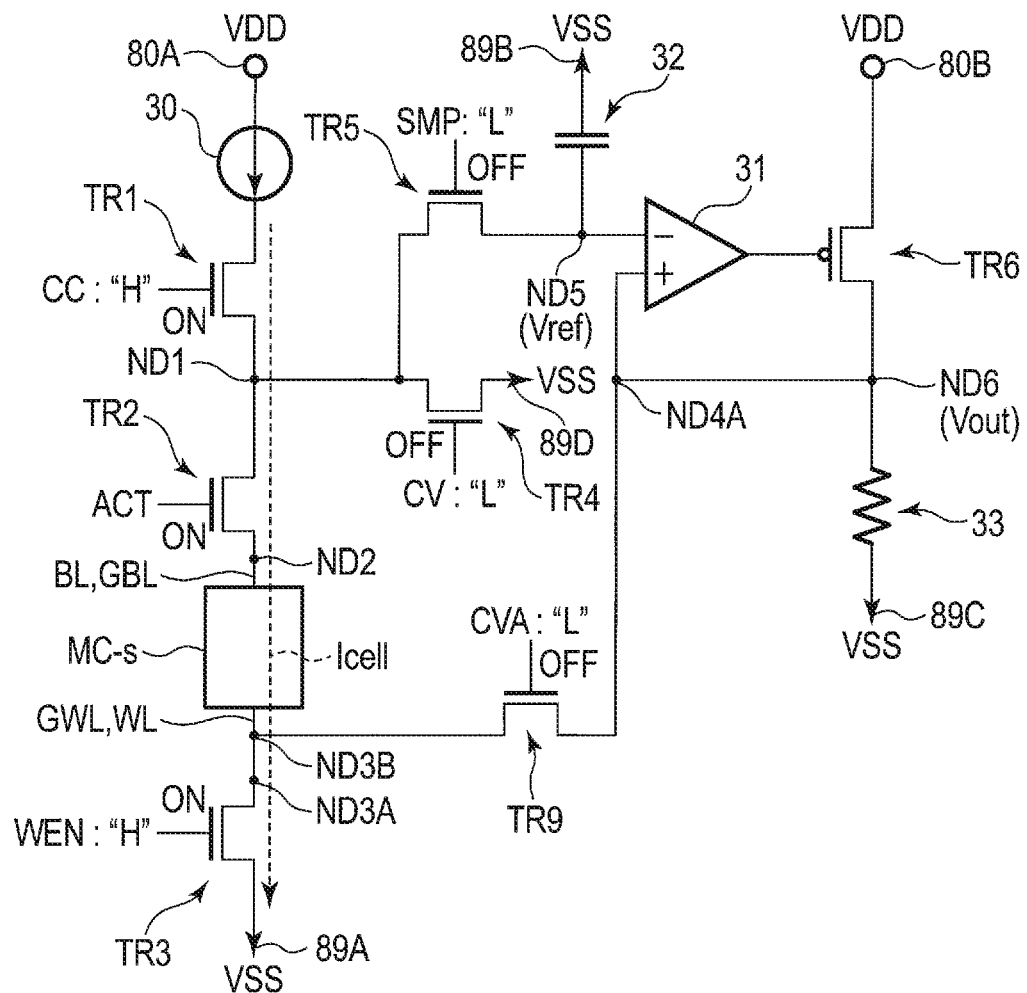
F I G. 21

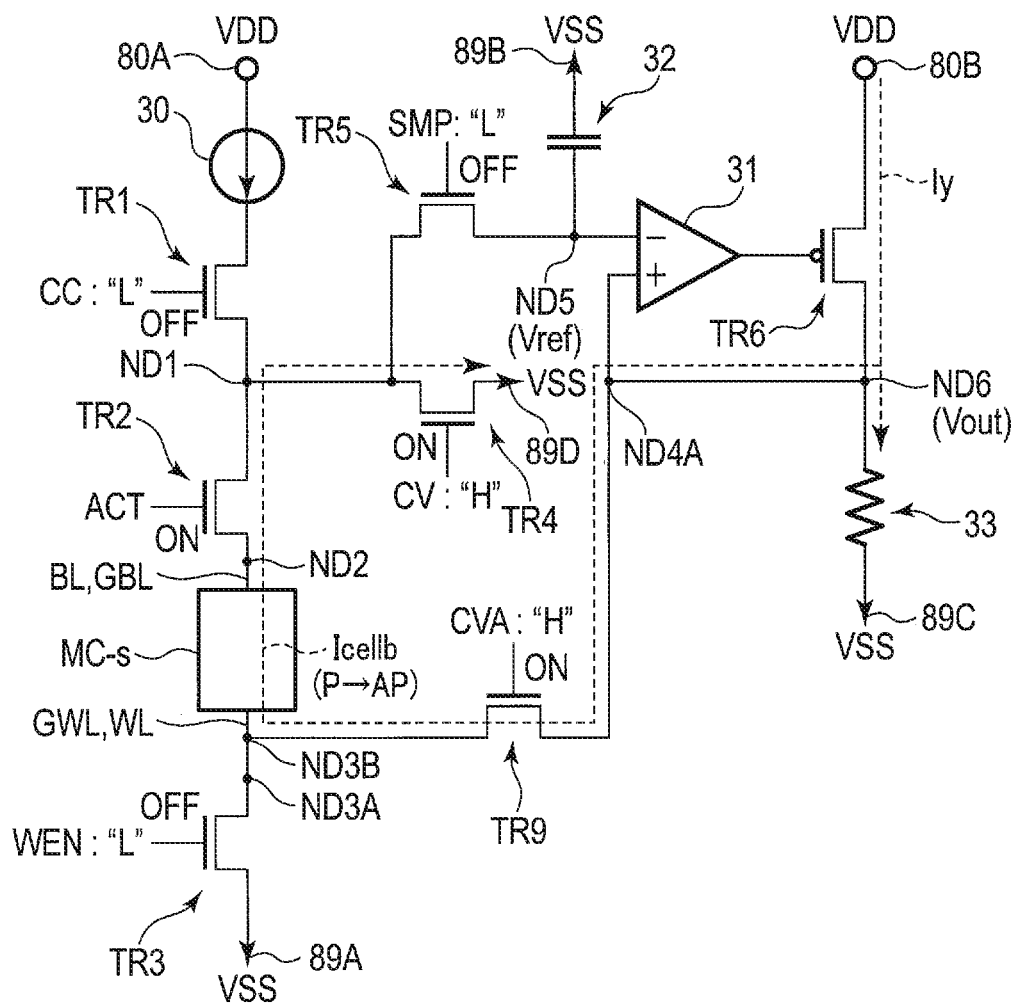
F I G. 22

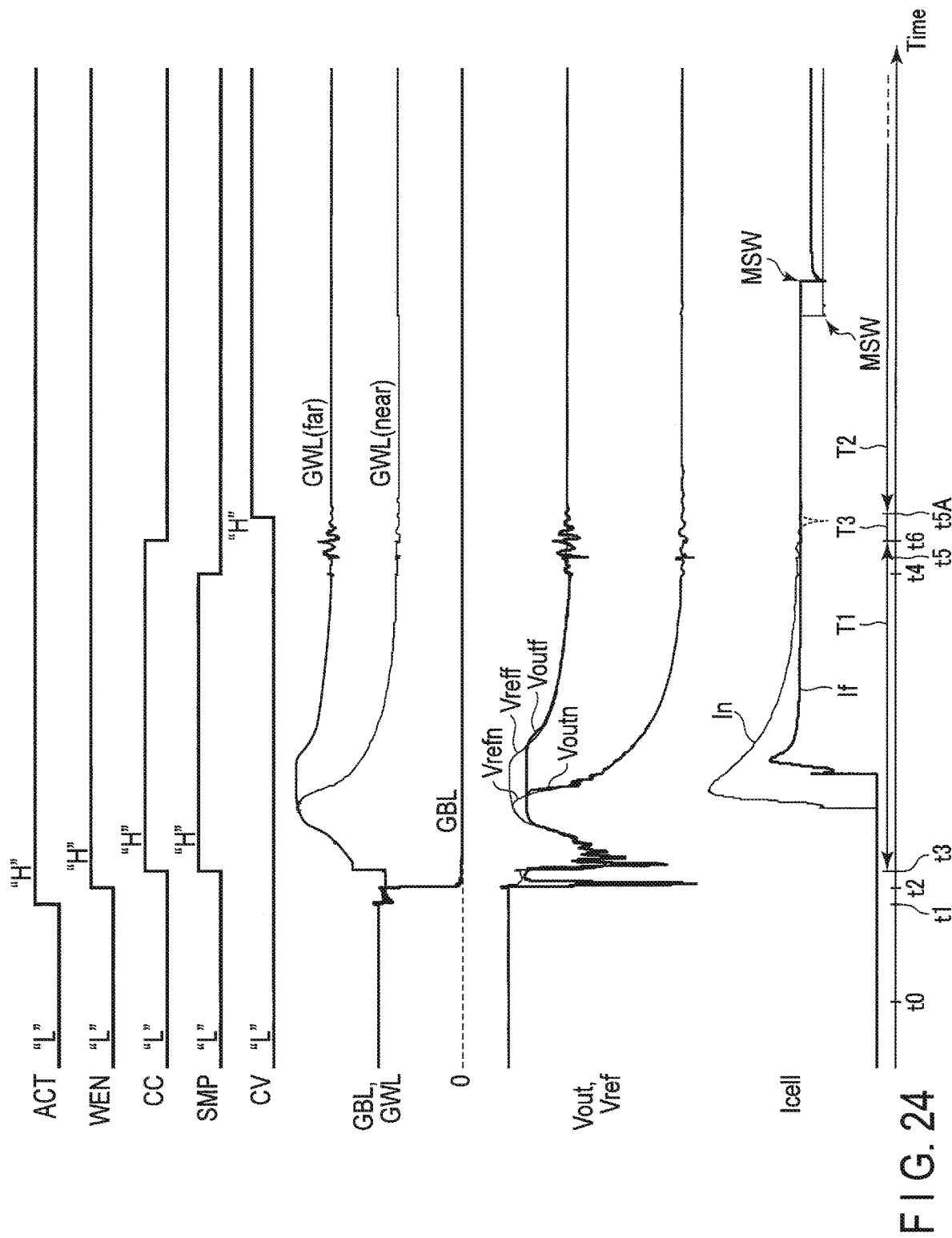
F I G. 24

MEMORY DEVICE

CROSS-REFERENCE TO RELATED APPLICATIONS

This application is based upon and claims the benefit of priority from Japanese Patent Application No. 2019-054203, filed Mar. 22, 2019, the entire contents of which are incorporated herein by reference.

FIELD

Embodiments described herein relate generally to a memory device.

BACKGROUND

In recent years, research and development of novel memory devices have been promoted.

BRIEF DESCRIPTION OF THE DRAWINGS

FIG. 1 is a view illustrating a configuration example of a memory device of a first embodiment.

FIG. 5 is a view illustrating a configuration example of the memory cell array of the memory device of the first embodiment.

FIG. 6 and FIG. 7 are views illustrating configuration examples of the memory device of the first embodiment.

FIG. 10, FIG. 11, FIG. 12 and FIG. 13 are views for describing an operation example of the memory device of the first embodiment.

FIG. 15, FIG. 16 and FIG. 17 are views for describing an operation example of the memory device of the second embodiment.

FIG. 18 is a view illustrating a configuration example of a memory device of a third embodiment.

FIG. 20, FIG. 21 and FIG. 22 are views for describing an operation example of the memory device of the fourth embodiment.

FIG. 23 and FIG. 24 are views illustrating modifications of the memory devices of the embodiments.

DETAILED DESCRIPTION

Figure 2:
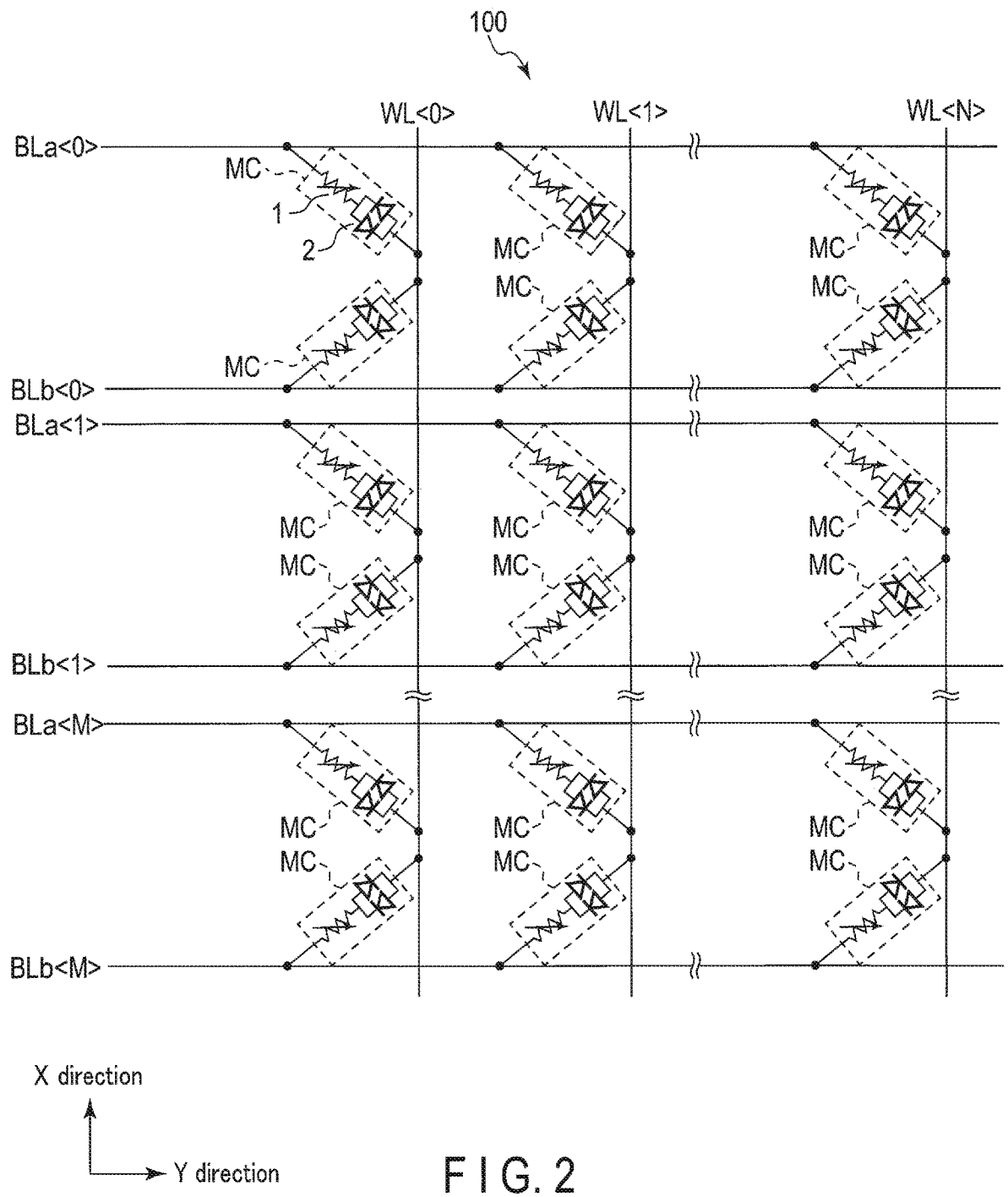
FIG. 2 is a view illustrating a configuration example of a memory cell array of the memory device of the first embodiment.

Memory devices of embodiments and control methods of the memory devices will be described with reference to FIG. 1 to FIG. 24.

Hereinafter, the embodiments will be described in detail with reference to the accompanying drawings. In the description below, elements having the same function and structure are denoted by the same reference sign.

In addition, in each of the embodiments below, when constituent elements (e.g. word lines WL, bit lines BL, various voltages, and signals), which are denoted by reference signs ending with numerals/alphabetical characters for distinction, do not need to be distinguished, expressions (reference signs) without such numerals/alphabetical characters at the ends are used.

In general, according to one embodiment, a memory device includes: a first interconnect; a second interconnect; a memory cell including a variable resistive element, the memory cell being electrically connected between the first interconnect and the second interconnect; and a write circuit including a first current source circuit and a voltage source circuit, the write circuit being configured to write data to the memory cell by using a write pulse, wherein the write circuit is configured to: supply the write pulse to the memory cell by using the first current source circuit in a first period from a first time of a start of supply of the write pulse to a second time, and supply the write pulse to the memory cell by using the voltage source circuit in a second period from a third time to a fourth time of an end of the supply of the write pulse.

(1) First Embodiment

Referring to FIG. 1 to FIG. 13, a memory device of a first embodiment will be described.

(a) Configuration Example

Referring to FIG. 1 to FIG. 8, a configuration of the memory device of the present embodiment will be described.

FIG. 1 is a block diagram illustrating one configuration example of the memory device of the present embodiment.

As illustrated in FIG. 1, a memory device 500 of the present embodiment includes a memory cell array 100, a row control circuit 110, a column control circuit 120, a write circuit 140, a read circuit 150, an I/O circuit 160, a voltage generation circuit 170, and a control circuit 190.

Each of one or more memory cell arrays 100 includes a plurality of memory cells MC. Each memory cell MC includes, for example, a variable resistive element. The variable resistive element is used as a memory element for storing data. Note that, in some cases, one memory cell array 100 is representative of a set of a plurality of memory areas.

The row control circuit 110 controls a plurality of rows of the memory cell array 100. A decoded result (row address) of an address ADR is supplied to the row control circuit 110. The row control circuit 110 sets a row (e.g. a word line), which is based on the decoded result of the address ADR, in a selected state. Hereinafter, the row (or word line) which is set in the selected state is referred to as "selected row (or selected word line)". A row other than the selected row is referred to as "unselected row (or unselected word line)".

The row control circuit 110 includes a global word line select circuit 111, a word line select circuit 112, a global word line driver circuit, and a word line driver circuit.

The column control circuit 120 controls a plurality of columns of the memory cell array 100. A decoded result (column address) of an address ADR is supplied to the column control circuit 120. The column control circuit 120 sets a column (e.g. at least one bit line), which is based on the decoded result of the address ADR, in a selected state. Hereinafter, the column (or bit line) which is set in the selected state is referred to as "selected column (or selected bit line)". A column other than the selected column is referred to as "unselected column (or unselected bit line)".

The column control circuit 120 includes a global bit line select circuit 121, a bit line select circuit 122, a global bit line driver circuit, and a bit line driver circuit.

The write circuit 140 executes various controls for a write operation (data write). The write circuit 140 supplies, at a time of a write operation, a write pulse, which is formed by current and/or voltage, to the memory cell MC via the row control circuit 110 and column control circuit 120. Thereby, data DT is written to the memory cell MC.

For example, the write circuit 140 includes a write driver circuit 141, a voltage source, a current source, and a latch circuit.

The read circuit 150 executes various controls for a read operation (data read). The read circuit 150 supplies, at a time of a read operation, a read pulse (e.g. read current) to the memory cell MC via the row control circuit 110 and column control circuit 120. The read circuit 150 senses a potential or a current value of the bit line BL. Thereby, data DT in the memory cell MC is read.

For example, the read circuit 150 includes a voltage source and/or a current source, a latch circuit, and a sense amplifier circuit.

Note that the write circuit 140 and read circuit 150 are not limited to mutually independent circuits. For example, the write circuit and read circuit may be provided in the memory device 500 as one integral circuit including mutually usable common constituent elements.

The I/O circuit (input/output circuit) 160 is an interface circuit for transmitting and receiving various kinds of signals in the memory device 500.

At a time of a write operation, the I/O circuit 160 transfers data DT from a processor 900 of an external device (a controller or host device) as write data to the write circuit 140. At a time of a read operation, the I/O circuit 160 transfers data DT, which is output from the memory cell array 100 to the read circuit 150, as read data to the processor 900.

The I/O circuit 160 transfers an address ADR and a command CMD from the processor 900 to the control circuit 190. The I/O circuit 160 transmits and receives various kinds of control signals CNT between the control circuit 190 and the external device.

The voltage generation circuit 170 generates voltages for various kinds of operations of the memory cell array 100, by using power supply voltage provided from the external device. For example, at a time of a write operation, the voltage generation circuit 170 outputs various voltages, which are generated for the write operation, to the write circuit 140. At a time of a read operation, the voltage generation circuit 170 outputs various voltages, which are generated for the read operation, to the read circuit 150.

The control circuit (also referred to as "state machine", "sequencer" or "internal controller") 190 controls the operations of respective circuits in the memory device 500, based on the control signal CNT, address ADR and command CMD.

For example, the command CMD is a signal indicative of an operation which the memory device 500 is to execute. For example, the address ADR is a signal indicative of coordinates of at least one memory cell (hereinafter, also referred to as "selected cell") that is a target of operation in the memory cell array 100. For example, the control signal CNT is a signal for controlling the operation timing between the external device and the memory device 500, and the operation timing in the inside of the memory device 500.

The control circuit 190 includes, for example, a command decoder, an address decoder, and a latch circuit.

FIG. 2 is an equivalent circuit diagram illustrating an example of the configuration of the memory cell array of the memory device.

As illustrated in FIG. 2, in the memory cell array 100, a plurality word lines WL (WL<0>, WL<1>, . . . , WL<N>) are arranged in a Y direction. Each word line WL extends in an X direction. In the memory cell array 100, a plurality of bit lines BL (BLa<0>, BLa<1>, . . . , BLa<M>, BLb<0>, BLb<1>, . . . , BLb<M>) are arranged in the X direction. Each bit line BL extends in the Y direction. Here, N and M are positive natural numbers.

Memory cells MC are disposed at intersection positions between the bit lines BL and word lines WL. One end of the memory cell MC is connected to the bit line BL, and the other end of the memory cell MC is connected to the word line WL.

The memory cells MC arranged in the X direction are commonly connected to one word line WL. The memory cells MC arranged in the Y direction are commonly connected to one bit line BL.

When the memory device of the present embodiment is a resistance change type memory, one memory cell MC includes one variable resistive element 1 and one switching element 2.

The variable resistive element 1 and switching element 2 are connected in series between the bit line BL and word line WL. One end of the variable resistive element 1 is connected to the bit line BL, and the other end of the variable resistive element 1 is connected to the word line WL via the switching element 2.

The variable resistive element 1 functions as a memory element of the memory cell MC. The variable resistive element 1 may have a plurality of resistance values in accordance with a change of the resistance state of the element 1. By correlation between the resistance values of the variable resistive element 1 and data, the variable resistive element 1 is used as the memory element which stores data of 1 bit or more.

The switching element 2 switches ON/OFF (selection/non-selection) of the memory cell MC.

The switching element 2 is set in an ON state (low-resistance state, conductive state) when a voltage of a threshold voltage or more of the switching element 2 is applied to the memory cell MC. The switching element 2 is set in an OFF state (high-resistance state, non-conductive state) when a voltage of less than the threshold voltage of the switching element 2 is applied to the memory cell MC.

The switching element 2 that is in the conductive state can pass current in the memory cell MC. In accordance with a potential difference between the bit line and the word line, the ON-state switching element 2 supplies to the variable resistive element 1 a current flowing from the bit line side toward the word line side, or a current flowing from the word line side toward the bit line side. In this manner, the switching element 2 is an element which can pass current through the memory element 1 in both directions. For example, the switching element 2 functions as a bidirectional diode.

Figure 3:
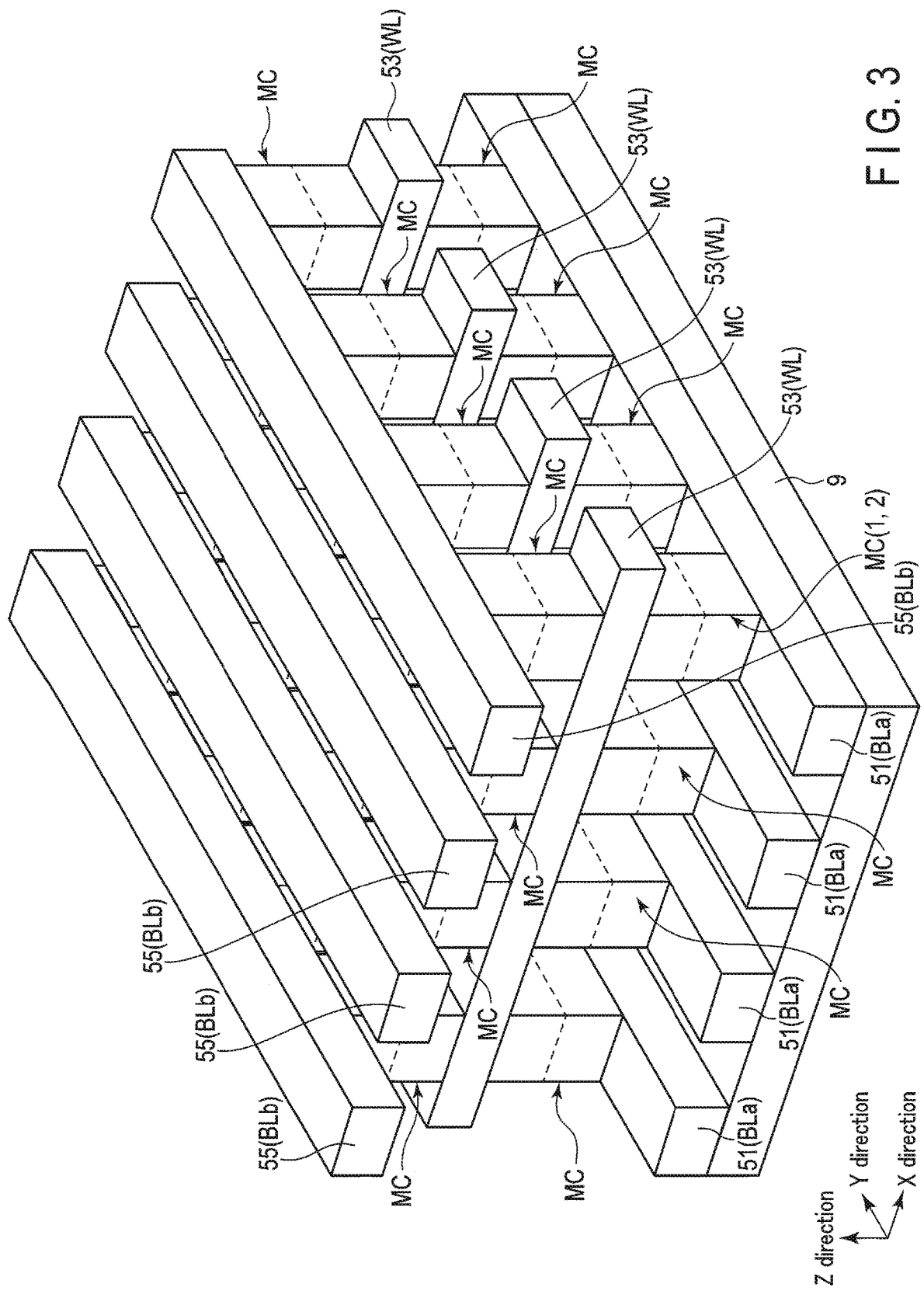
FIG. 3 is a view illustrating a structural example of the memory cell array of the memory device of the first embodiment.

FIG. 3 is a bird's-eye view illustrating a configuration example of the memory cell array in the memory device of the present embodiment.

As illustrated in FIG. 3, in the memory cell array 100, the memory cells MC are provided between interconnects 51, 53 and 55.

The interconnects 51, 53 and 55 are provided above a surface of a substrate 9.

The interconnects 51 extend in the Y direction. The interconnects 51 are arranged in the X direction. The interconnects 53 extend in the X direction. The interconnects 53 are arranged in the Y direction. The interconnects 55 extend in the Y direction. The interconnects 55 are arranged in the X direction.

The interconnects 53 are provided above the interconnects 51 in the Z direction. The interconnects 55 are provided above the interconnects 53 in the Z direction. The interconnects 53 are provided between the interconnects 51 and interconnects 55 in the Z direction.

In the example of FIG. 3, the interconnects 51 and interconnects 55 are bit lines BL (BLa, BLb), and the interconnects 53 are word lines.

Note that the X direction is a direction parallel to the surface of the substrate 9. The Y direction is a direction parallel to the surface of the substrate 9, and is a direction crossing (e.g. perpendicular to) the X direction. The Z direction is a direction perpendicular to the surface (X-Y plane) of the substrate 9.

The memory cells MC are three-dimensionally arranged in the memory cell array 100. The memory cells MC are arranged in a matrix in the X-Y plane. The memory cells MC are arranged in the Z direction.

The memory cells MC are provided between the interconnects (bit lines BLa) 51 and interconnects (word lines WL) 53. The memory cells MC are provided between the interconnects (word lines WL) 53 and interconnects (bit lines BLb) 55. The interconnect 53 is provided between two memory cells MC which are arranged in the Z direction.

The two memory cells MC arranged in the Z direction share the interconnect 53 between the two memory cells MC arranged in the Z direction.

The two memory cells MC arranged in the Z direction are connected to a common word line WL. The two memory cells MC arranged in the Z direction are connected to mutually different bit lines BLa and BLb. One of the two memory cells MC arranged in the Z direction is connected to a bit line BLa located below the word line WL in the Z direction. The other memory cell MC is connected to a bit line BLb located above the word line WL in the Z direction.

Hereinafter, a layer including memory cells MC, which are two-dimensionally arranged in the X-Y plane, is referred to as "mat (MAT)", "memory tile" or "cell layer". The memory cell array 100 of FIG. 2 has a configuration in which two mats are arranged in the Z direction.

For example, in the memory cell array 100 of FIG. 2, the memory cell MC is a stacked body including the memory element 1 and switching element 2.

Note that the configuration of the memory cell array 100 is not limited to the example of FIG. 3. For example, the configuration of the memory cell array 100 may be a configuration in which memory cells MC are arranged only two-dimensionally in the memory cell array 100. In this case, the number of mats of the memory cell array 100 is one.

Note that when the substrate 9 is a semiconductor substrate (e.g. a silicon substrate), circuits (hereinafter referred to as "CMOS circuits") other than the memory cell array 100, such as the row control circuit 110 and column control circuit 120, may be provided on the semiconductor substrate 9. Thereby, the memory cell array 100 is provided above the CMOS circuits in the Z direction.

Figure 4:
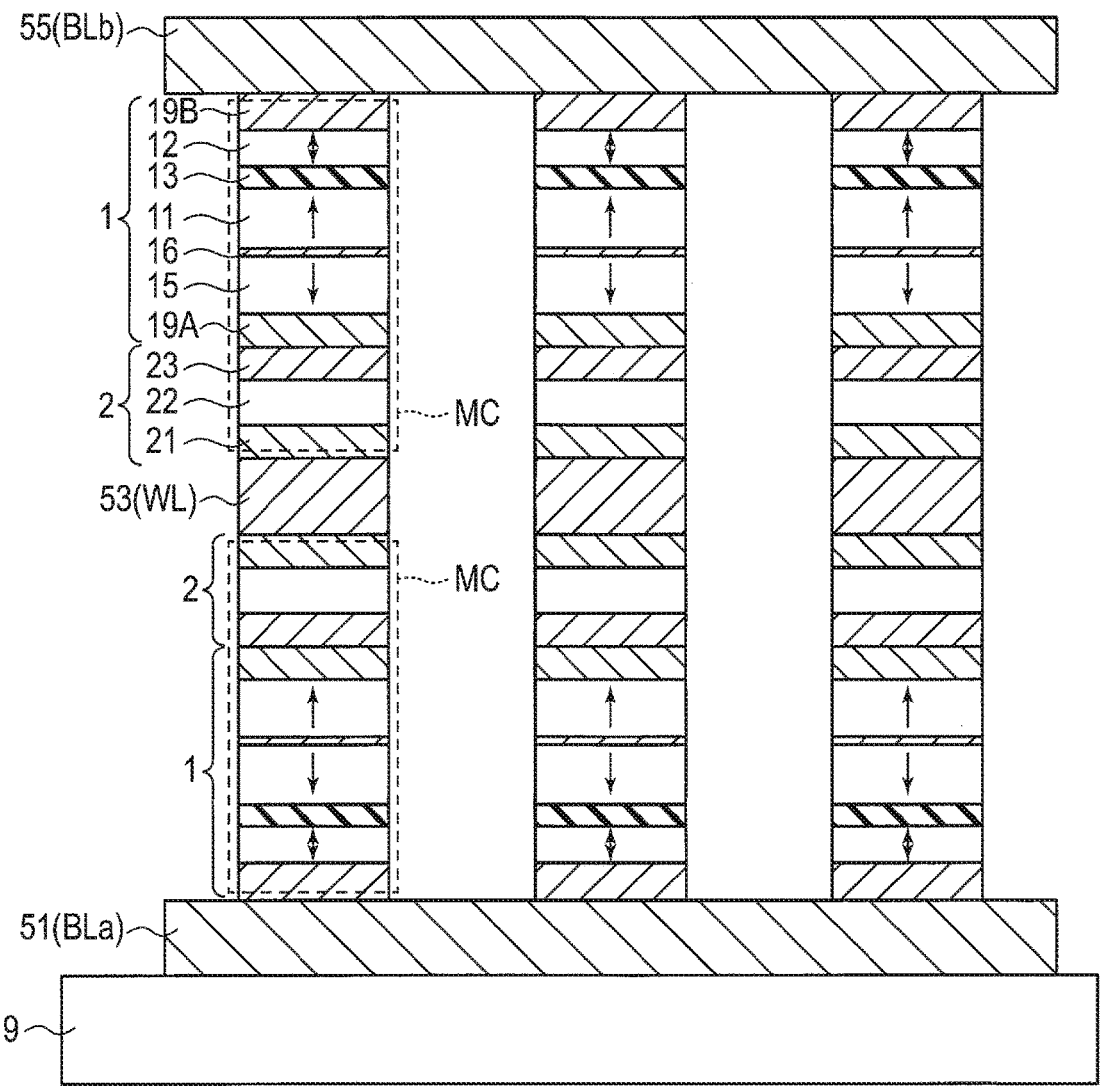
FIG. 4 is a view illustrating a structural example of a memory cell of the memory device of the first embodiment.

FIG. 4 is a cross-sectional view illustrating a configuration example of the memory cell in the memory device of the present embodiment. In FIG. 4, a cross section of the memory cell array, taken in the Y direction, is illustrated.

For example, the memory device of the present embodiment is a magnetic memory (e.g. MRAM) in which a magnetoresistive effect element is used as the memory element 1.

In the memory cell array 100 having the configuration of FIG. 3, the memory cell MC is a stacked body including the magnetoresistive effect element 1 and switching element 2.

In the present embodiment, the magnetoresistive effect element 1 includes two magnetic layers 11 and 12 and a nonmagnetic layer 13. The nonmagnetic layer 13 is provided between the two magnetic layers 11 and 12 in the Z direction. The two magnetic layers 11 and 12 and nonmagnetic layer 13, which are arranged in the Z direction, form a magnetic tunnel junction (MTJ).

In the description below, the magnetoresistive effect element 1 including the magnetic tunnel junction is referred to as "MTJ element". Hereinafter, the nonmagnetic layer 13 in the MTJ element 1 is referred to as "tunnel barrier layer".

The magnetic layer 11, 12 is a ferromagnetic layer including, for example, cobalt, iron, and/or boron. The magnetic layer 11, 12 may be a single-layer film, or a multi-layer film (e.g. an artificial lattice film). The tunnel barrier layer 13 is an insulation film including, for example, magnesium oxide. The tunnel barrier layer 13 may be a single-layer film, or a multi-layer film.

For example, each magnetic layer 11, 12 has a perpendicular magnetic anisotropy. The direction of the easy magnetization axis of each magnetic layer is perpendicular to the layer surface (film surface) of the magnetic layer. Each magnetic layer 11, 12 has magnetization perpendicular to the layer surface of the magnetic layer 11, 12. The direction of magnetization of each magnetic layer 11, 12 is parallel to the arrangement direction (Z direction) of the magnetic layers 11 and 12.

The direction of magnetization of the magnetic layer 12 is variable. The direction of magnetization of the magnetic layer 11 is invariable (in a fixed state). Hereinafter, the magnetic layer 12 with the variable direction of magnetization is referred to as "storage layer". Hereinafter, the magnetic layer 11 with the invariable (fixed-state) direction of magnetization is referred to as "reference layer". Note that, in some cases, the storage layer 12 is also referred to as "free layer", "magnetization free layer", or "magnetization variable layer". In some cases, the reference layer 11 is also referred to as "pin layer", "pinned layer", "magnetization invariable layer", or "magnetization fixed layer".

In the present embodiment, the description "the direction of magnetization of the reference layer (magnetic layer) is invariable" or "the direction of magnetization of the reference layer (magnetic layer) is in the fixed state" means that when current or voltage for changing the direction of magnetization of the storage layer is supplied to the magnetoresistive effect element, the direction of magnetization of the reference layer does not change by the supplied current or voltage before and after the supply of the current/voltage.

For example, the MTJ element 1 of the present embodiment includes two electrodes 19A and 19B. The magnetic layers 11 and 12 and tunnel barrier layer 13 are provided between the two electrodes 19A and 19B in the Z direction. The reference layer 11 is provided between the electrode 19A and tunnel barrier layer 13. The storage layer 12 is provided between the electrode 19B and tunnel barrier layer 13.

For example, a shift cancel layer 15 is provided in the MTJ element 1. The shift cancel layer 15 is provided between the reference layer 11 and electrode 19A. The shift cancel layer 15 is a magnetic layer for relaxing the influence of a stray magnetic field of the reference layer 11.

A nonmagnetic layer 16 is provided between the shift cancel layer 15 and reference layer 11. The nonmagnetic layer 16 is, for example, a metallic layer such as a Ru layer.

The reference layer 11 is antiferromagnetically coupled to the shift cancel layer 15 via the nonmagnetic layer 16. Thereby, a stacked body including the reference layer 11, nonmagnetic layer 16 and shift cancel layer 15 forms a SAF (synthetic antiferromagnetic) structure. In the SAF structure, the direction of magnetization of the shift cancel layer 15 is opposite to the direction of magnetization of the reference layer 11. By the SAF structure, the direction of magnetization of the reference layer 11 is set in the fixed state.

For example, the MTJ element 1 may include an underlying layer (not shown) and/or a cap layer (not shown). The underlying layer is provided between the magnetic layer (here, shift cancel layer) 15 and the electrode 19A. The underlying layer is a nonmagnetic layer (e.g. an electrically conductive compound layer). The underlying layer is a layer for improving the characteristics (e.g. crystallinity and/or magnetic characteristics) of the magnetic layer 15 that is in contact with the underlying layer. The cap layer is a nonmagnetic layer (e.g. an electrically conductive compound layer) between the magnetic layer (here, storage layer) 12 and the electrode 19B. The cap layer is a layer for improving the characteristics (e.g. crystallinity and/or magnetic characteristics) of the magnetic layer 12 that is in contact with the cap layer.

Note that at least one of the underlying layer and cap layer may be regarded as a constituent element of the electrode 19 (19A, 19B).

The switching element 2 includes two electrodes 21 and 23 and a switching layer (hereinafter, also referred to as "resistance change layer") 22. The switching layer 22 is provided between the two electrodes (conductive layers) 21 and 23. In the switching element 2, the electrode 21, switching layer 22 and electrode 23 are arranged in the Z direction. The switching layer 22 is provided between the two electrodes 21 and 23. The material of the switching layer 22 is, for example, a transition metal compound, or a chalcogenide compound.

When two memory cells MC are arranged in the Z direction, one of the memory cells MC is disposed above the other memory cell MC via an interconnect 53 in the Z direction. The two memory cells MC arranged in the Z direction are provided such that the internal configurations 1 and 2 of the memory cells MC are arranged in a mirror-image relationship with respect to the interconnect 53.

For example, in the memory cell MC below the interconnect 53, the MTJ element 1 is provided on the interconnect 51, and the switching element 2 is provided on the MTJ element 1. The interconnect 53 is provided on the switching element 2. To be more specific, in the MTJ element 1, the electrode 19B, storage layer 12, tunnel barrier layer 13, reference layer 11, metallic layer 16, shift cannel layer 15 and electrode 19A are disposed on the interconnect 51 in the order from the interconnect 51 side toward the interconnect 53 side. In the switching element 2 on the MTJ element 1, the electrode 23, switching layer 22 and electrode 21 are disposed on the electrode 19A in the order from the interconnect 51 side toward the interconnect 53 side.

For example, in the memory cell MC above the interconnect 53, the switching element 2 is provided on the interconnect 53, and the MTJ element 1 is provided on the switching element 2. The interconnect 55 is provided on the MTJ element 1. To be more specific, in the switching element 2 below the MTJ element 1, the electrode 21, switching layer 22 and electrode 23 are disposed on the interconnect 53 in the order from the interconnect 53 side toward the interconnect 55 side (in the order from the interconnect 51 side toward the interconnect 53 side). In the MTJ element 1, the electrode 19A, shift cancel layer 15, metallic layer 16, reference layer 11, tunnel barrier layer 13, storage layer 12 and electrode 19B are disposed on the electrode 23 in the order from the interconnect 53 side toward the interconnect 55 side. The interconnect 55 is disposed on the electrode 19B.

Note that in the memory cell array 100, the order of arrangement of the MTJ element 1 and switching element 2 in the Z direction and the order of arrangement of the constituent elements (layers) of the elements 1 and 2 are not limited to the above examples, if the desired functions/characteristics can be achieved. In accordance with the internal configuration of the memory cell array, the order of arrangement of the MTJ element 1 and switching element 2 in the Z direction and the order of arrangement of the constituent elements (layers) of the elements 1 and 2 can be changed as needed.

Data write to the memory cell is executed by controlling the direction of magnetization of the storage layer of the MTJ element 1. The resistance state (resistance value) of the MTJ element 1, which corresponds to the magnetization alignment state, is changed by the data write.

For example, when the direction of magnetization of the storage layer 12 is switched by STT (Spin transfer torque), a write current is supplied to the MTJ element 1.

A change from an AP state to a P state of the magnetization alignment state of the MTJ element 1, or a change from the P state to AP state of the magnetization alignment state of the MTJ element 1, is controlled according to whether the write current flows from the storage layer 12 to the reference layer 11, or flows from the reference layer 11 to the storage layer 12. The current value of write current is set to a value which is less than a magnetization switching threshold value of the reference layer 11 and is not less than a magnetization switching threshold value of the storage layer 12. A spin torque, which contributes to magnetization switching (reversal of magnetization) of the storage layer 12, is generated by the write current flowing in the MTJ element. The generated spin torque is applied to the storage layer 12.

When the magnetization alignment state of the MTJ element 1 is changed from the AP state to P state (hereinafter, also referred to as "P write"), a spin torque of the spin (electrons) in the same direction as the direction of magnetization of the reference layer 11 is applied to the magnetization of the storage layer 12. When the direction of magnetization of the storage layer 12 is opposite to the direction of magnetization of the reference layer 11, the direction of magnetization of the storage layer 12 is changed to the same direction as the direction of magnetization of the reference layer 11 by the applied spin torque.

As a result, the magnetization alignment state of the MTJ element 1 is set in the P state.

When the magnetization alignment state of the MTJ element 1 is changed from the P state to AP state (hereinafter, also referred to as "AP write"), a spin torque of the spin in the direction opposite to the direction of magnetization of the reference layer 11 is applied to the magnetization of the storage layer 12. When the direction of magnetization of the storage layer 12 is identical to the direction of magnetization of the reference layer 11, the direction of magnetization of the storage layer 12 is changed to the direction opposite to the direction of magnetization of the reference layer 11 by the applied spin torque.

As a result, the magnetization alignment state of the MTJ element 1 is set in the AP state.

Read of data from the memory cell is executed by determining the magnetization alignment state (resistance value) of the MTJ element 1. At a time of data read, a read current is supplied to the MTJ element 1. The current value of the read current is set to a value which is less than the magnetization switching threshold value of the storage layer 12. Based on an output value (e.g. a current value or a voltage value) from the MTJ element 1 to which the read current is supplied, the resistance value (magnetization alignment state) of the MTJ element 1 is equivalently determined.

Thereby, the data in the memory cell is determined and read.

<Example of Layout>

Referring to FIG. 5, a description will be given of the layout of each circuit in a semiconductor chip in the memory device of the present embodiment.

FIG. 5 illustrates, in an extracted manner, the memory cell array 100, write driver circuit, sense amplifier circuit, global word line select circuit, bit line driver circuit, and word line driver circuit.

As illustrated in FIG. 5, a plurality of circuit regions 510 are provided in the semiconductor chip (substrate) 9. Hereinafter, the circuit region is referred to as "core region (or bank)". A group of circuits in the core region is referred to as "core circuit".

In the example of FIG. 5, four core regions 510 are illustrated. The number of core regions 510 in the semiconductor chip may be three or less, or may be five or more.

For example, the core regions 510 are arranged in the X direction.

When a hierarchical word line structure is applied to the memory cell arrays 100, a plurality of global word lines GWL are provided for the memory cell arrays 100. A predetermined number of word lines WL are connected to a corresponding one of the global word lines GWL via select elements (e.g. field-effect transistors).

For example, the global word line GWL extends over a plurality of core regions 510.

The plural core regions (core circuits) 510 share one global word line select circuit 111.

Of the four core regions 510, two regions 510 are provided on one end side in the X direction of the global word line select circuit 111, and the other two regions 510 are provided on the other end side in the X direction of the global word line select circuit 111.

Based on the decoded result of the address ADR, the global word line select circuit 111 selects (activates) one global word line GWL from among the global word lines GWL.

Each core region 510 includes the memory cell arrays 100, word line select circuit 112, global bit line select circuit 121, bit line select circuits 122, write driver circuit 141, and sense amplifier circuit 151.

A plurality of memory cell arrays (also referred to as "memory regions", "tiles" or "segments", for the purpose of distinction) 100 are provided in the core region 510. For example, four memory cell arrays 100 are provided in one core region 510.

The four memory cell arrays 100 are arranged in the core region 510 in a matrix of 2×2. Two memory cell arrays 100 are arranged in the X direction. Two memory cell arrays 100 are arranged in the Y direction.

In the core region 510, the memory cell arrays 100 share the word line select circuit 112. The word line select circuit 112 is provided between the memory cell arrays 100 which are arranged in the X direction.

Based on the decoded result of the address ADR, the word line select circuit 112 selects (activates) one or more word lines WL from among the word lines WL. The word line select circuit 112 is connected to the global word lines GWL and the word lines WL in the memory cell arrays 100. The word line select circuit 112 includes a plurality of select elements (e.g. field-effect transistors) which control the connection (ON/OFF) between the global word line GWL and word line WL.

A plurality of bit line select circuits 122 are provided in the core region 510. For example, six bit line select circuits 122 are provided in one core region 510.

Three bit line select circuits 122 are provided for two memory cell arrays 100 which are arranged in the Y direction.

One memory cell array 100 is provided between two bit line select circuits 122 in the Y direction. One bit line select circuit 122 is provided between memory cell arrays 100 which are arranged in the Y direction. Two memory cell arrays 100 share the bit line select circuit 122 between the memory cell arrays 100.

Like the memory cell array 100 of FIG. 2, when the memory cell array 100 includes a stacked structure of two mats, the bit line select circuit 122 on one end side of the Y direction of the memory cell array 100 is connected to the bit lines BL (interconnects 51) on the bottom side of the memory cell array 100, and the bit line select circuit 122 on the other end side of the Y direction of the memory cell array 100 is connected to the bit lines BL (interconnects 55) on the top side of the memory cell array 100. For example, the bit line select circuit 122 between the two memory cell arrays 100 is used for selecting the bit line BL on the top side of the two memory cell arrays 100.

Based on the decoded result of the address ADR, the bit line select circuit 122 selects (activates) one or more bit lines BL from among the bit lines BL. The bit line select circuit 122 includes a plurality of select elements (e.g. field-effect transistors) for selecting the bit line BL.

When a hierarchical bit line structure is applied to the memory cell arrays 100, a plurality of global bit lines GBL are provided for the memory cell arrays 100. A predetermined number of bit lines BL are connected to a corresponding one of the global bit lines GBL via select elements (e.g. field-effect transistors).

The global bit line select circuit 121 is provided between bit line select circuits 122 which are arranged in the X direction. The global bit line select circuit 121 neighbors the word line select circuit 112 in the Y direction. The global bit line select circuit 121 is provided between bit line select circuits 122 which are arranged in the X direction.

Based on the decoded result of the address ADR, the global bit line select circuit 121 selects (activates) one or more global bit lines GBL from among the global bit lines GBL.

The write driver circuit 141 and sense amplifier circuit 151 are provided in the core region 510. For example, the write driver circuit 141 and sense amplifier circuit 151 are provided at one corner in the core region 510 having a rectangular planar shape.

The sense amplifier circuit 151 passes a read current through a selected cell at a time of a data read operation. The sense amplifier circuit 151 senses a current value of the read current flowing through the selected cell, or a variation of potential of the bit line. Based on the sensed result of the sense amplifier circuit 151, the data in the memory cell is determined and read.

The write driver circuit 141 supplies a write pulse to a selected cell at a time of a data write operation. At a time of a write operation using STT, the write driver circuit 141 passes a write current as a write pulse in a direction from the selected word line toward the selected bit line, or in a direction from the selected bit line toward the selected word line, in accordance with write data.

FIG. 6 is a schematic diagram illustrating a relationship between positions (coordinates) of memory cells in the memory cell array and the write circuit.

In the example illustrated in FIG. 6, the write driver circuit 141 of the write circuit 140 is provided on one end side of the X direction of the memory cell array 100.

The distance between a selected cell and the write driver circuit 141 varies in accordance with the coordinates (position) of the selected cell in the memory cell array 100. Thus, even when a plurality of memory cells are connected to the same word line, it is possible that a parasitic resistance (e.g. interconnect resistance), which is imparted to the memory cells, varies in each memory cells, in accordance with the coordinates of the memory cells in the memory cell array 100.

There is a tendency that the parasitic resistance of a memory cell (hereinafter, also referred to as "Far cell") MC-f, which is far from the write driver circuit 141, is greater than the parasitic resistance of a memory cell (hereinafter, also referred to as "Near cell") MC-n, which is near the write driver circuit 141. The distance between the Far cell MC-f and the write driver circuit 141 is greater than the distance between the Near cell MC-n and the write driver circuit 141.

Similarly, as regards the memory cells connected to the same bit line, a variation in parasitic resistance, which is imparted to the memory cells, occurs in accordance with the distance between the memory cells and the write driver circuit.

Even when the write driver circuits are disposed at both ends of the X direction of the memory cell array 100, or even when the write driver circuit is disposed on one end side of the Y direction of the memory cell array 100, the parasitic resistance imparted to the memory cells varies in each memory cells, in accordance the coordinates of the memory cells in the memory cell array.

In the MRAM of the present embodiment, the write circuit 140 (write driver circuit 141) includes a current source circuit (e.g. a constant current source circuit) 300 and a voltage source circuit (e.g. a constant voltage source circuit) 310. The MRAM of the present embodiment generates a write pulse (write current) by using the current source circuit 300 and voltage source circuit 310. The generated write pulse is supplied to the selected cell.

Thereby, the MRAM of the present embodiment can decrease write errors. In addition, the MRAM of this embodiment can suppress breakdown of memory elements.

<Configuration of Write Circuit>

FIG. 7 is an equivalent circuit diagram illustrating an example of the configuration of the write driver circuit of the write circuit in the MRAM of the present embodiment.

The write driver circuit 141 includes a plurality of field-effect transistors (hereinafter referred to as "transistors") TR1, TR2, TR3, TR4, TR5 and TR6, a current source 30, an amplifier (operational amplifier) 31, a capacitance element 32, and a resistance element 33.

As illustrated in FIG. 7, one end of the current source 30 is connected to a power supply terminal 80A. A power supply voltage VDD is applied to the power supply terminal 80A.

One end (one of two source/drains) of a current path of the N-type transistor TR1 is connected to the other end of the current source 30. The other end (the other of the two source/drains) of the current path of the transistor TR1 is connected to a node ND1. A control signal CC is supplied to the gate of the transistor TR1.

One end of a current path of the N-type transistor TR2 is connected to the node ND1. The other end of the current path of the transistor TR2 is connected to a node ND2. A control signal ACT is supplied to the gate of the transistor TR2.

The node ND2 is connected to a terminal on an input side (current source side) of the write current in the memory cell array 100 with respect to the write driver circuit 141.

One end of a current path of the N-type transistor TR3 is connected to a node ND3. The other end of the current path of the transistor TR3 is connected to a ground terminal (reference voltage terminal) 89A. A control signal (hereinafter, also referred to as "write enable signal") WEN is supplied to the gate of the transistor TR3.

A ground voltage (reference potential) VSS is applied to the ground terminal 89A. The node ND3 is connected to a terminal on an output side (sink side) of current in the memory cell array 100 with respect to the write driver circuit 141.

The memory cell MC is connected between the node ND2 and a node ND3.

One end of a current path of the N-type transistor TR4 is connected to the node ND1. The other end of the current path of the transistor TR4 is connected to the node ND4. A control signal CV is supplied to the gate of the transistor TR4.

One end of a current path of the N-type transistor TR5 is connected to the node ND1. The other end of the current path of the transistor TR5 is connected to a node ND5. A control signal SMP is supplied to the gate of the transistor TR5.

One end of the capacitance element 32 is connected to the node ND5. The other end of the capacitance element 32 is connected to a ground terminal 89B.

One input terminal (non-inversion input terminal) IT1 of the amplifier 31 is connected to the node ND4. The other input terminal (inversion input terminal) IT2 of the amplifier 31 is connected to the node ND5. An output terminal of the amplifier 31 is connected to the gate of the transistor TR6. The amplifier 31 outputs, from the output terminal, a signal that is based on a comparison result between the potential of the node ND4 and the potential of the node ND5.

One end of a current path of the P-type transistor TR6 is connected to a power supply terminal 80B. The other end of the current path of the transistor TR6 is connected to a node ND6. The gate of the transistor TR6 is connected to the output terminal of the amplifier 31. The node ND6 is connected to the input terminal IT1 of the amplifier 31 via the node ND4. A power supply voltage VDD is supplied to the power supply terminal 80B.

One end of the resistance element 33 is connected to the node ND6. The other end of the resistance element 33 is connected to a ground terminal 89C.

For example, the current source circuit 300 of the write driver circuit 141 (write circuit) includes the current source 30 and transistor TR1.

For example, the voltage source circuit 310 of the write driver circuit 141 (write circuit) includes the amplifier 31, capacitance element 32, resistance element 33, and transistors TR4, TR5 and TR6.

The write driver circuit 141 operates by the control of signal levels of the control signals CC, ACT, WEN, SMP and CV.

By the output of a write current Iwr from the write driver circuit 141, a current (hereinafter referred to as "cell current") Icell flows to a selected cell MC-s. The cell current Icell has a current value corresponding to the supplied write current Iwr and the coordinates (parasitic resistance) of the memory cell MC.

Figure 8:
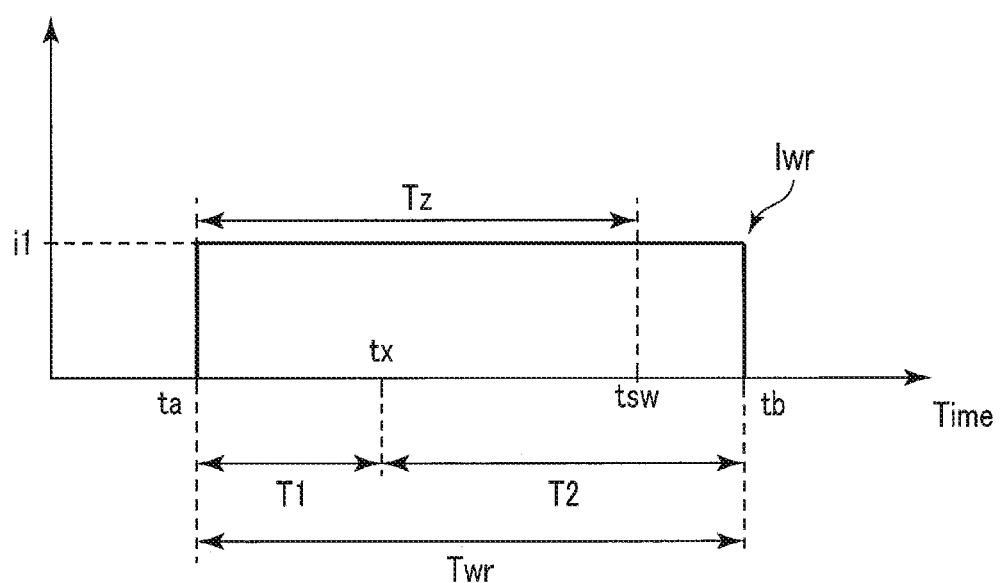
FIG. 8 is a timing chart illustrating an operation example of the memory device of the first embodiment.

FIG. 8 is a view schematically illustrating the waveform of a write current in the MRAM of the present embodiment.

The write driver circuit 141 outputs a pulse-shaped write current Iwr which is illustrated in FIG. 8. The write current Iwr has a current value i1. The current value i1 is not less than the magnetization switching threshold value of the MTJ element 1. The write current Iwr has a pulse width Twr.

In the MRAM of the present embodiment, the write driver circuit 141 outputs (generates) the write current Iwr by using the current source circuit 300, in a period T1 from the start (time instant ta) of supply of the write current Iwr to a certain time instant tx. The write driver circuit 141 outputs the write current Iwr by using the voltage source circuit 310, in a period T2 from the certain time instant tx to the stop (time instant tb) of supply of the write current Ir.

The time instant tx at the boundary between the period T1 and period T2 is a time instant before a time instant tsw at which magnetization switching of the MTJ element, to which the write current Iwr is supplied, occurs. The time instant tsw at which magnetization switching occurs in the MTJ element to which the write current Iwr is supplied (a period Tz from the supply of write current to the occurrence of magnetization switching of the MTJ element) can be set by the magnitude of the write current Iwr and various parameters of the magnetic layers of the MTJ element, etc.

For example, the period T1 is shorter than the period Tz from the supply of the write current Iwr to the occurrence of magnetization switching of the MTJ element 1.

In an example of switching between the current source circuit 300 and voltage source circuit 310 in the write driver 141, the supply of current from the voltage source circuit is started at the same time as the stop of supply of current from the current source circuit 300. In this case, the time instant of the stop of supply of current from the current source circuit 300 coincides with the time instant of the supply of current from the voltage source circuit.

In this manner, in the MRAM of the present embodiment, the write driver circuit 141 functions as the current source (e.g. constant current source) in the period T1 from the start of supply of current to the memory cell MC to the certain time instant tx, and functions as the voltage source (e.g. constant voltage source) in the period T2 from the certain time instant tx to the end of supply of current.

As will be described later, the MRAM of the present embodiment can reduce the influence of the location dependency of memory cells MC in the memory cell array 100, with respect to the magnitude of the write current that is supplied to the memory cells in the memory cell array.

When AP write is executed on the MTJ element 1, the MRAM of the present embodiment can avoid the application of a relatively high voltage to the MTJ element which has changed from the low-resistance state to high-resistance state.

(b) Operation Example

Referring to FIG. 9 to FIG. 12, an operation example of the MRAM of the present embodiment will be described.

Figure 9:
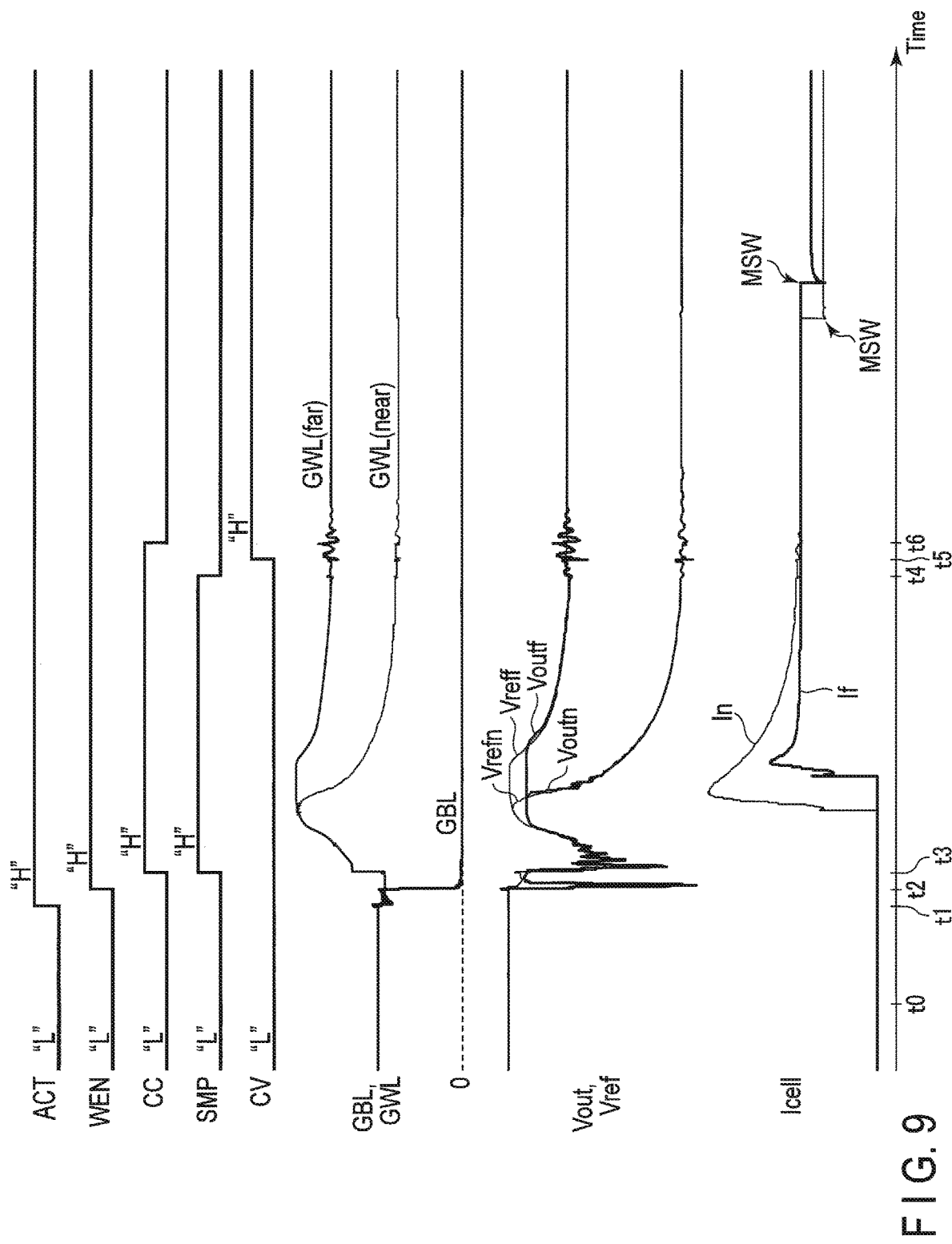
FIG. 9 is a view for describing an operation example of the memory device of the first embodiment.

FIG. 9 is a timing chart illustrating an operation example of the MRAM of the present embodiment. FIG. 9 illustrates transitions of signal levels of respective signals, changes of potentials of interconnects, and changes of the current flowing in the memory cell and the voltage applied to the memory cell. In FIG. 9, an abscissa axis of the graph corresponds to time, and the ordinate axis of the graph corresponds to voltage values or current values of respective waveforms.

Figure 11:
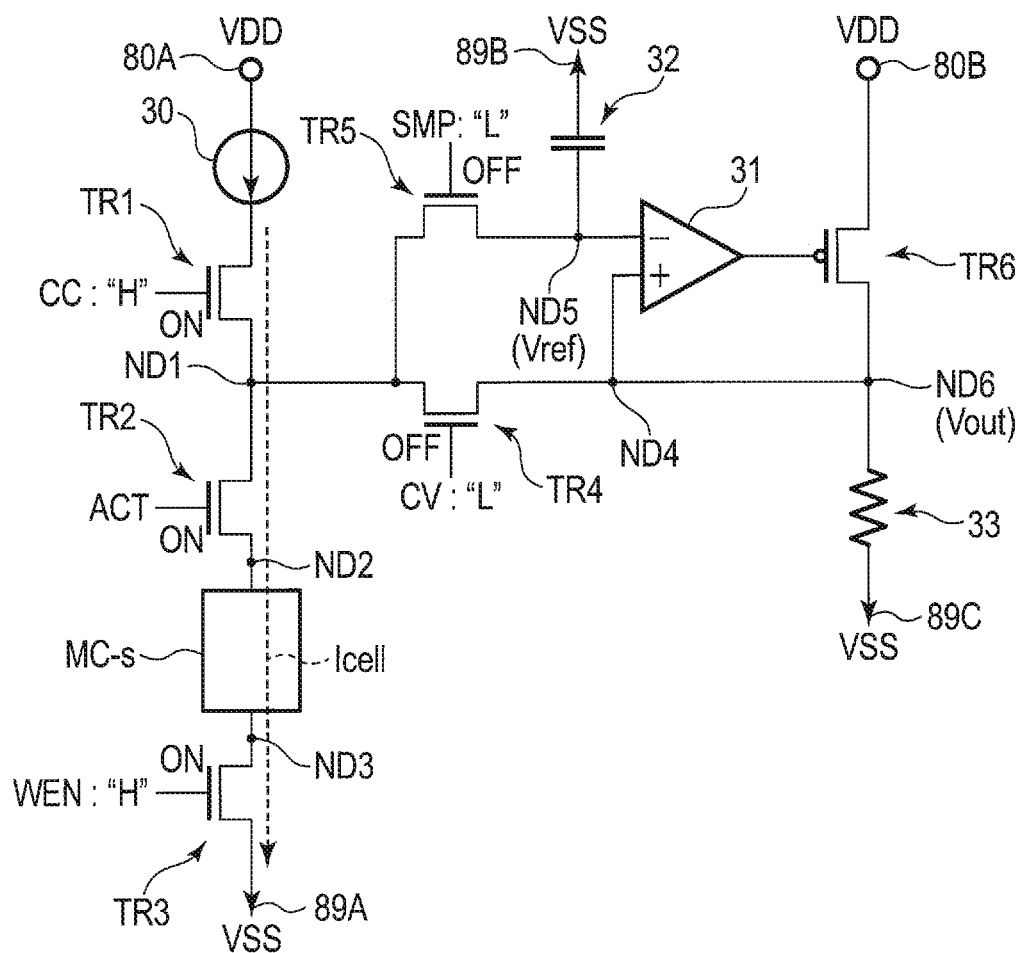

FIG. 10 to FIG. 12 are views schematically illustrating the operation states of the write driver circuit at certain timings in the operation in the MRAM of the present embodiment.

<Time Instant t0>

As illustrated in FIG. 9, at time instant t0, the write operation of the MRAM 1 is started.

For example, the processor 900 illustrated in FIG. 1 transfers to the MRAM 1 of the present embodiment the write command CMD, address ADR indicative of the selected cell, data to be written in the memory cell array 100 (hereinafter referred to as "write data"), and control signal CNT.

In the MRAM 1, the I/O circuit 160 receives the command CMD, address ADR, control signal CNT, and write data DT.

The I/O circuit 160 transfers the command CMD, address ADR and control signal CNT to the control circuit 190. The I/O circuit 160 transfers the write data DT to the write circuit 140.

The control circuit 190 decodes the command CMD and address ADR. The control circuit 190 transfers the decoded result of the address ADR to the row control circuit 110 and column control circuit 120. The control circuit 190 transfers the decoded result of the command CMD to the write circuit 140. Based on the control signal CNT, the control circuit 190 controls the operation timings of the respective circuits in the MRAM 500.

Based on the write data, the write circuit 140 sets the voltages which are applied to the word line and bit line, and the direction (source side/sink side) of supply of current to the MTJ element.

For example, an AP write operation (an operation for changing the magnetization alignment state of the MTJ element from the P state to AP state) is executed on the selected cell MC-s. In the present example, at the time of the AP write operation, the word line WL is set to a high potential side (current source side), and the bit line BL is set to a low potential side (current sink side). It should be noted, however, that in the MRAM in which the write operation of the STT method is used, the relationship between the potential of the word line and the potential of the bit line at the time of the AP write may change, depending on the connection relation of the MTJ element to the bit line and word line (the direction in which write current flows in the MTJ element).

<Time Instant t1>

At time instant t1, the control circuit 190 changes the signal level of the control signal ACT from "L (Low)" level to "H (High)" level.

By the signal ACT of "H" level, in the write driver circuit 141 of FIG. 6, the transistor TR2 is set in the ON state.

The node ND1 is connected to the node ND2 via the ON-state transistor TR2.

Thereby, the write driver circuit 141 is set in an activated state with respect to the memory cell array 100.

<Time Instant t2>

At time instant t2, the control circuit 190 changes the signal level of the control signal (write enable signal) WEN from "L" level to "H" level.

By the signal WEN of "H" level, the transistor TR3 is set in the ON state.

Based on the write data, for example, when the global bit line GBL and bit line (local bit line) BL are connected to the node ND3, the global bit line GBL and bit line BL are electrically connected to the ground terminal 89A via the ON-state transistor TR3.

Therefore, the potential of the global bit line GBL and the potential of the bit line BL are set at 0 V.

<Time Instant t3>

At time instant t3, the control circuit 190 changes the signal level of the control signal CC from "L" level to "H" level.

By the signal CC of "H" level, the transistor TR1 is set in the ON state.

Thereby, the current source 30 is electrically connected to the memory cell MC via the ON-state transistors TR1 and TR2. The memory cell MC is electrically connected to the ground terminal 89A via the ON-state transistor TR3.

A write current (write pulse) Iwr is output from the write driver circuit 141 to the memory cell array 100. The write driver circuit 141 functions as the constant current source circuit when current is output from the current source 30. Note that the current source 30 outputs current having a constant current value.

Thereby, a cell current Icell flows in the selected cell MC. The cell current Icell has a current value which sets the switching element 2 in the ON state and changes the magnetization alignment state of the MTJ element (here, a current value which changes the magnetization alignment state of the MTJ element 1 from the P state to AP state).

By the supply of the write current Iwr, the potential of the global word line GWL rises. However, even in the case of the memory cells connected to the same word line, the magnitude of parasitic resistance of a memory cell (Near cell), which is near the connection node (e.g. node ND2) between the output terminal of the write driver circuit 141 and the word line WL, is different from the magnitude of parasitic resistance of a memory cell (Far cell), which is far from the connection node (e.g. node ND2) between the output terminal of the write driver circuit 141 and the word line WL, in accordance with the coordinates of a selected cell in the memory cell array 100. In accordance with the magnitude of the parasitic resistance, the potential of the word line WL at the time of selection of the Far cell is different from the potential of the word line WL at the time of selection of the Near cell.

As regards the cell current Icell, the magnitude of a cell current If flowing to the Far cell is substantially equal to the magnitude of a cell current In flowing to the Near cell.

At time instant t3, in the MRAM of the present embodiment, the control circuit 190 changes the signal level of the control signal SMP from "L" level to "H" level.

By the "H" level signal SMP, the transistor TR5 is set in the ON state. Thereby, the capacitance element 32 is electrically connected to the node ND1 via the ON-state transistor TR5.

At this time, as illustrated in FIG. 10, the output current of the current source 30 is supplied as a current Icell to the selected cell MC. Along with this, a current Ia is supplied to the capacitance element 32 via the ON-state transistor TR5. Therefore, the capacitance element 32 is charged. The current value of the current Ia from the current source (constant current source) 30 corresponds to the current value of the cell current Icell.

Therefore, a potential Vref of the node ND5 has a value corresponding to the potential of the selected cell MC-s. Accordingly, the potential Vref has a value corresponding to the coordinates of the selected cell MC-s in the memory cell array 100.

Note that the transition of the signal level of the control signal SMP may not coincide with the transition of the signal level of the control signal CC. <Time Instant t4>

At time instant t4, the control circuit 190 changes the signal level of the control signal SMP from "H" level to "L" level. By the signal SMP of "L" level, as illustrated in FIG. 11, the transistor TR5 is set in the OFF state. Thereby, the capacitance element 32 is electrically disconnected from the node ND1 and selected cell MC-s by the OFF-state transistor TR5.

For example, the time instant t4 (the timing at which the control signal SMP is changed from "H" level to "L" level) is properly set, based on a period from the start of supply of write current to the stabilization of the potential of the node ND1 (the potential of the selected cell).

<Time Instant t5>

At time instant t5, the control circuit 190 changes the signal level of the control signal CV from "L" level to "H" level. By the signal CV of "H" level, the transistor TR4 is set in the ON state. The node ND4 is electrically connected to the node ND1.

<Time Instant t6>

At time instant t6, as illustrated in FIG. 12, the control circuit 190 changes the signal level of the control signal CC from "H" level to "L" level. By the signal CC of "L" level, the transistor TR1 is set in the OFF state.

Thereby, the current source 30 is electrically disconnected from the node ND1 and selected cell MC.

In the amplifier 31, the potential Vref of the node ND5 is supplied to the input terminal IT2, and the potential of the node ND1 is supplied to the input terminal IT1.

The capacitance element 32 is charged in a period from time instant t3 to time instant t4. Therefore, after the transistor TR5 is set in the OFF state, the potential Vref of the node ND5 has a value corresponding to the charged potential (stored charge amount) of the capacitance element 32. As described above, the potential Vref is substantially equal to the potential of the selected cell MC-s at the time of supplying current from the current source 30.

The amplifier 31 supplies an output signal Sout, which corresponds to the difference between the potential Vref of the node ND5 and the potential of the node ND4, to the gate of the transistor TR6.

The transistor TR6 passes a current Ib from the power supply terminal 80B to the node ND6, by the driving power corresponding to the voltage value of the output signal Sout.

Thereby, a potential Vout of the node ND6 rises to a value corresponding to the output current Ib of the transistor TR6. For example, the potential Vout has a value that is equal to the potential Vref of the node ND5. In the AP write to the Far cell, a potential Voutf of the node ND6 may have a value substantially equal to a potential Vreff of the node ND5 corresponding to the current flowing in the Far cell. In the AP write to the Near cell, a potential Voutn of the node ND6 may have a value substantially equal to a potential Vrefn of the node ND5 corresponding to the current flowing in the Near cell.

At this time, in the selected cell MC, the current value of the cell current Icell is set to a value corresponding to the value of the potential Vout. Therefore, the current value of the cell current Icell becomes a value corresponding to (e.g. a potential substantially equal to) the potential of the selected cell MC-s at the time of supplying current from the current source 30.

In this manner, in a period after time instant t5, the write driver circuit 141 functions as the voltage source.

In the example of FIG. 9, the time instant t5 is a time instant between the time instant t3 of the start of supply of current by the current source circuit 300 and the time instant t6 of the stop of supply of current by the current source circuit 300. Therefore, in a period from time instant t5 to time instant t6, both the current from the current source circuit 300 and the current from the voltage source circuit 310 are supplied to the selected cell MC-s. In the present embodiment, even if the period of supply of current from the voltage source circuit 310 overlaps the period of supply of current from the current source circuit 300, the supply of excessive current to the selected cell MC-s is suppressed.

Note that when the time instant t5 at which the control signal CV is set at "H" level coincides with the time instant t6 at which the control signal CC is set at "L" level, the start of supply of current by the voltage source circuit 310 and the stop of supply of current by the current source circuit 300 are simultaneous.

Thereafter, by the cell current Icell, in the selected cell MC, the direction of magnetization of the storage layer of the MTJ element 1 is switched (reversed). For example, the magnetization alignment state of the MTJ element 1 changes from the P state to AP state. Here, the resistance value of the MTJ element 1 changes from the value corresponding to the P state (low-resistance state) to the value corresponding to the AP state (high-resistance state). Therefore, when the cell current Icell is being supplied by the constant voltage circuit 310, the current value of the cell current Icell lowers in accordance with the change of the resistance value of the MTJ element 1.

As a result, as indicated by a region MSW in FIG. 9, the current value of the cell current Icell varies due to the variation of the resistance value of the MTJ element 1.

Thereafter, the control circuit 190 changes the signal levels of the respective control signals ACT, CV and WEN from "H" level to "L" level at predetermined timings.

Thereby, the write driver circuit 141 is electrically disconnected from the selected cell MC-s.

By the above-described operation, the data associated with the AP state of the MTJ element is written in the selected cell MC-s.

As described above, the write operation (AP write) of the MRAM of the present embodiment is completed.

Note that in the MRAM of the present embodiment, the P write is substantially identical to the AP write operation illustrated in FIG. 9 to FIG. 12, except that only the direction of supply of write current is different.

In the write operation of the MRAM of the present embodiment, when the magnetization alignment state of the MTJ element is changed from the AP state (high-resistance state) to P state (low-resistance state), a write current/cell current, which flows from the bit line BL toward the word line WL, is supplied to the selected cell. In this case, like the above-described operation, the magnetization alignment state of the MTJ element of the selected cell is changed from the AP state to P state by the write current from the write driver circuit 141. Thereby, the data associated with the P state of the MTJ element is written in the selected cell.

In this manner, in the MRAM of the present embodiment, only the relationship in potential between the word line and bit line is different between the P write and AP write.

Note that in the read operation of the MRAM of the present embodiment, a well-known read operation (for example, data read using a DC method, a reference cell method, and/or self-reference method) can be applied as needed. Therefore, in the present embodiment, a description of the read operation of the MRAM of the embodiment is omitted.

(c) Verification

Figure 13:
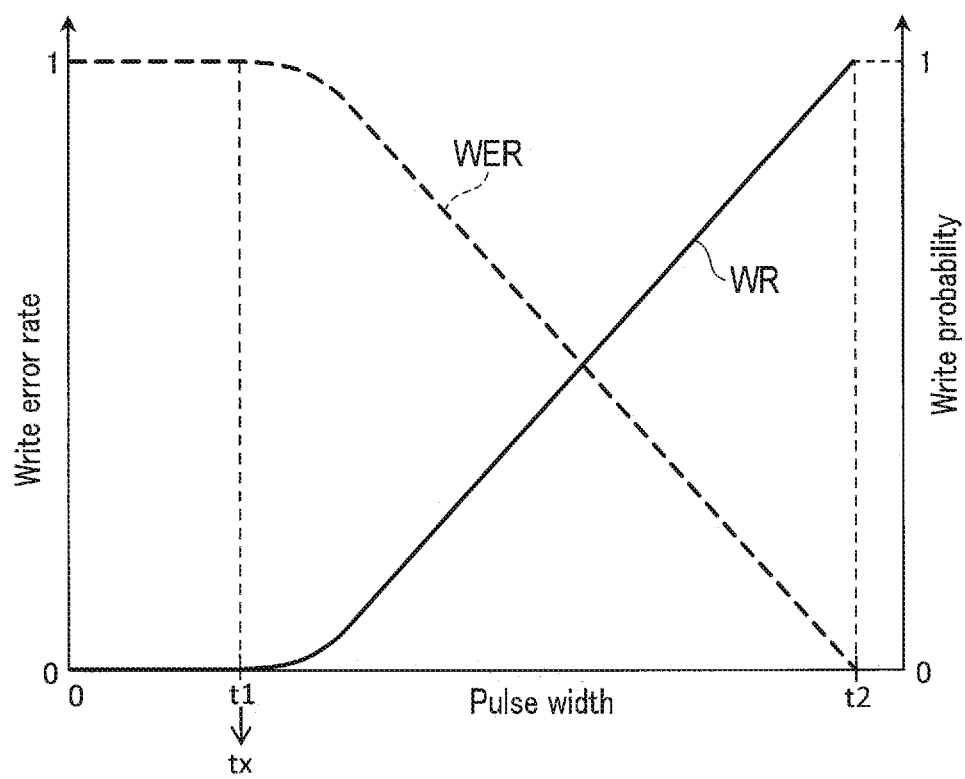

Referring to FIG. 13, more preferable conditions of the write current (cell current) in the write operation of the MRAM of the present embodiment will be verified.

FIG. 13 is a graph illustrating a pulse width of a write pulse, a write error rate, and a write probability.

In FIG. 13, the abscissa axis of the graph corresponds to the pulse width of the write pulse (the period of supply of cell current). In FIG. 13, one of the ordinate axes corresponds to the write error rate of the MTJ element, and the other ordinate axis corresponds to the write probability of the MTJ element (the magnetization switching probability of the storage layer). In FIG. 13, a broken line WER corresponds to the write error rate, and a solid line WR corresponds to the write probability (the success rate of magnetization switching of the storage layer). Note that when the write probability is indicated by "P", the write error rate is indicated by "1-P".

In the period (period T1 in FIG. 8) in which the write driver circuit is supplying, as the current source (e.g. constant current source), the write pulse (write current) for AP write to the selected cell, it is preferable that no magnetization switching occurs in the storage layer of the MTJ element 1, in order to suppress breakdown of the MTJ element due to a change of the magnetization alignment state from the P state (low-resistance state) to AP state (high-resistance state).

In the period (period T2 in FIG. 8) in which the write driver circuit is supplying, as the voltage source (e.g. constant voltage source), the write pulse for AP write to the selected cell, it is preferable that magnetization switching of the MTJ element occurs with relatively high probability, in order to enhance the reliability of data write.

As illustrated in FIG. 13, the write probability has a sufficiently low value in a period TA of the pulse width of the write pulse Iwr. In a period TB of the pulse width WP of the write pulse Iwr, the write probability has a relatively high value, and the write error rate has a relatively low value.

It is preferable that the time instant tx at the boundary between the period T1 and period T2 of the write pulse Iwr in FIG. 8 is set in consideration of the write error rate and write probability, while the time instant tx sets the period until the stabilization of the charge potential (potential applied to the selected cell) of the node by the output current of the current source.

For example, it is preferable that the time instant tx of the switching from the current source circuit 300 to the voltage source circuit 310 is set at a time instant at which, like the time instant t1 of FIG. 13, the period until the stabilization of the potential of the node is secured and the write probability has a sufficiently low value (e.g. 0).

It is preferable that the pulse width of the period T2 is set such that a time instant with a sufficiently low value (e.g. 0) of the write error rate exists in the period T2. Therefore, it is preferable that the pulse width of the period T2 is set such that a terminal end of the period T2 is set at a time instant after a time instant t2 in FIG. 13.

In this manner, the MRAM of the present embodiment can switch the generation source of the write pulse of the write driver circuit from the current source circuit to the voltage source circuit, and can supply the write pulse to the selected cell.

Thereby, the MRAM of the present embodiment can suppress breakdown of the MTJ element at the time of supplying the write pulse by using the current source. The MRAM of the present embodiment can ensure the reliability of data write at the time of supplying the write pulse by using the voltage source.

(d) Conclusion

The write operation of the MRAM is executed by supplying the write pulse (e.g. write current) to the memory cell in the memory cell array.

For example, when the voltage source is used for supplying current to the memory cell in the memory cell array, the current value of write current supplied to the Far cell (the memory cell far from the write circuit) in the memory cell array becomes smaller than the current value of write current supplied to the Near cell (the memory cell near the write circuit), due to parasitic resistance (interconnect resistance).

If the current value of the cell current flowing in the Far cell becomes lower than the magnetization switching threshold value of the MTJ element due to the parasitic resistance, a write error (an error in which the magnetization of the storage layer fails to be switched) to the Far cell may occur.

If the current value of the write pulse generated by the voltage source is increased in consideration of the decrease of the current value due to the parasitic resistance, a relatively large cell current flows in the Near cell. In this case, it is possible that breakdown of the MTJ element of the Near cell occurs.

When the current source is used for supplying current to the memory cell, in the memory cell in which the resistance state (magnetization alignment state) of the MTJ element is changed from the low-resistance state (P state) to high-resistance state (AP state), a relatively high voltage is applied to the MTJ element that is changed into the high-resistance state. In this case, it is possible that breakdown of the MTJ element occurs.

Even when the write circuits are provided at both ends of the memory cell array, the same problem may arise between memory cells on the side of end portions of the memory cell array and memory cells on the side of a central portion of the memory cell array.

The write circuit (write driver circuit) of the magnetic memory (e.g. MRAM) of the present embodiment includes the current source circuit and voltage source circuit.

In the magnetic memory of the present embodiment, in a first period from the start of the write operation to a certain time instant, the write circuit supplies the write pulse to the memory cell by using the current source circuit. In a second period after the first period, the write circuit supplies the write pulse to the memory cell by using the voltage source circuit.

Thereby, the magnetic memory of the present embodiment can reduce write errors due to the location dependency (and parasitic resistance) of memory cells in the memory cell array.

Therefore, the magnetic memory of the present embodiment can enhance the reliability of data write.

Furthermore, in the write operation, the magnetic memory of the present embodiment can prevent an excessive voltage from being applied to the magnetoresistive effect element when the resistance state (magnetization alignment state) of the magnetoresistive effect element changes from the low-resistance state (P state) to high-resistance state (AP state).

Therefore, the magnetic memory of the present embodiment can suppress breakdown of the magnetoresistive effect element at the time of execution of the operation.

As described above, the memory device of the present embodiment can enhance the characteristics.

(2) Second Embodiment

Referring to FIG. 14 to FIG. 17, a memory device of a second embodiment and a control method thereof will be described.

(a) Configuration Example

Figure 14:
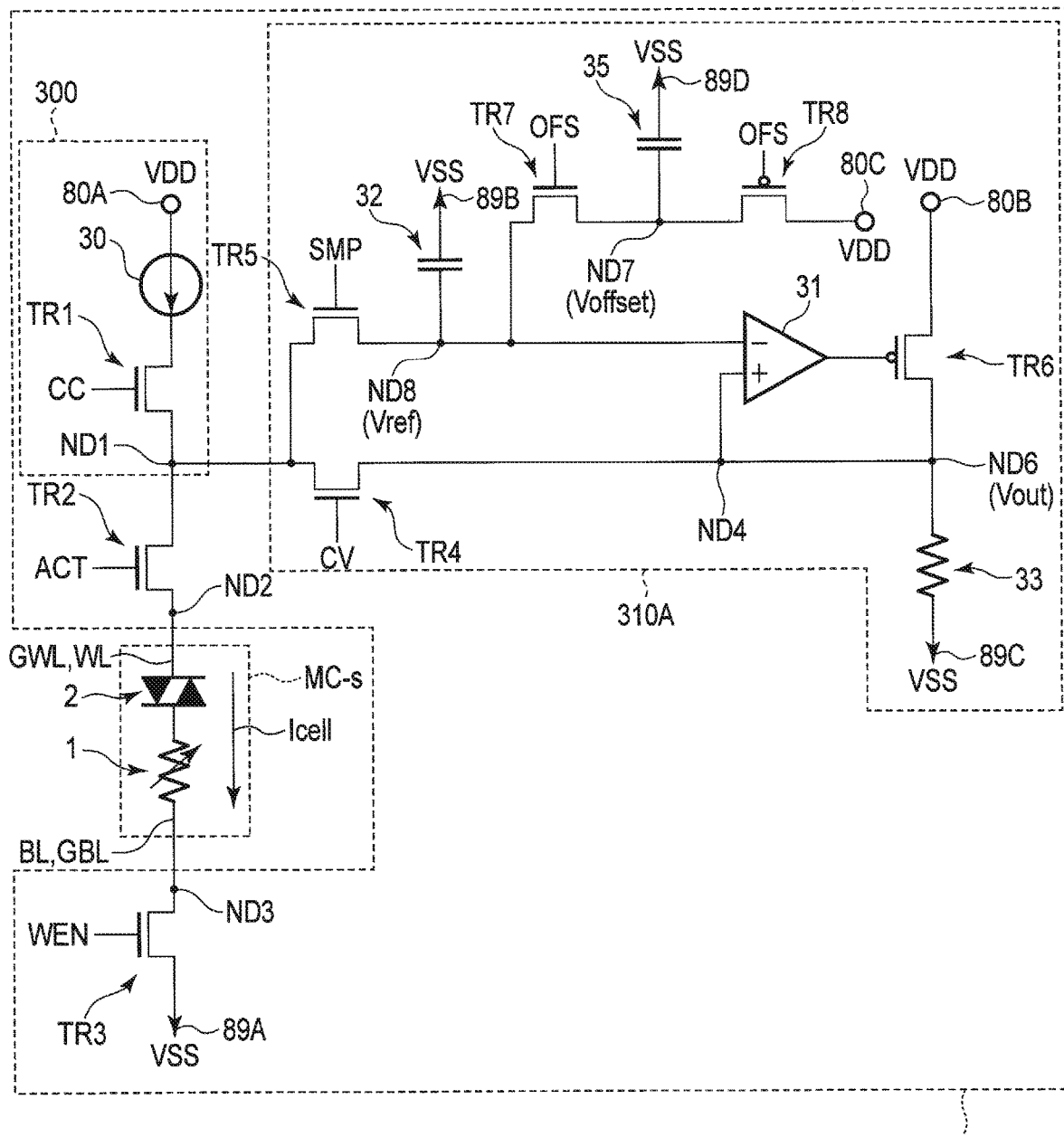
FIG. 14 is a view illustrating a configuration example of a memory device of a second embodiment.

FIG. 14 is an equivalent circuit diagram illustrating a configuration example of the memory device (e.g. MRAM) of the present embodiment. FIG. 14 illustrates a configuration example of a write circuit in the MRAM of this embodiment.

Like the MRAM of the first embodiment, the write circuit (write driver circuit) of FIG. 14 supplies a write pulse (write current) to the memory cell array.

As illustrated in FIG. 14, in the MRAM of the present embodiment, a write driver circuit 141A of the write circuit includes, in addition to the configuration of FIG. 7, transistors TR7 and TR8 and a capacitance element 35.

One end of a current path of the N-type transistor TR7 is connected to a node ND7. The other end of the current path of the transistor TR7 is connected to a node ND8. A control signal OFS is supplied to the gate of the transistor TR7.

One end of a current path of the P-type transistor TR8 is connected to the node ND7. The other end of the current path of the transistor TR8 is connected to a power supply terminal 80C. A power supply voltage VDD is supplied to the power supply terminal 80C.

One end of the capacitance element 35 is connected to the node ND7. The other end of the capacitance element 35 is connected to a ground terminal 89D.

As will be described below, the MRAM of the present embodiment can add, by the capacitance element 35, an offset voltage to the potential generated by the capacitance element 32.

(b) Operation Example

Figure 15:
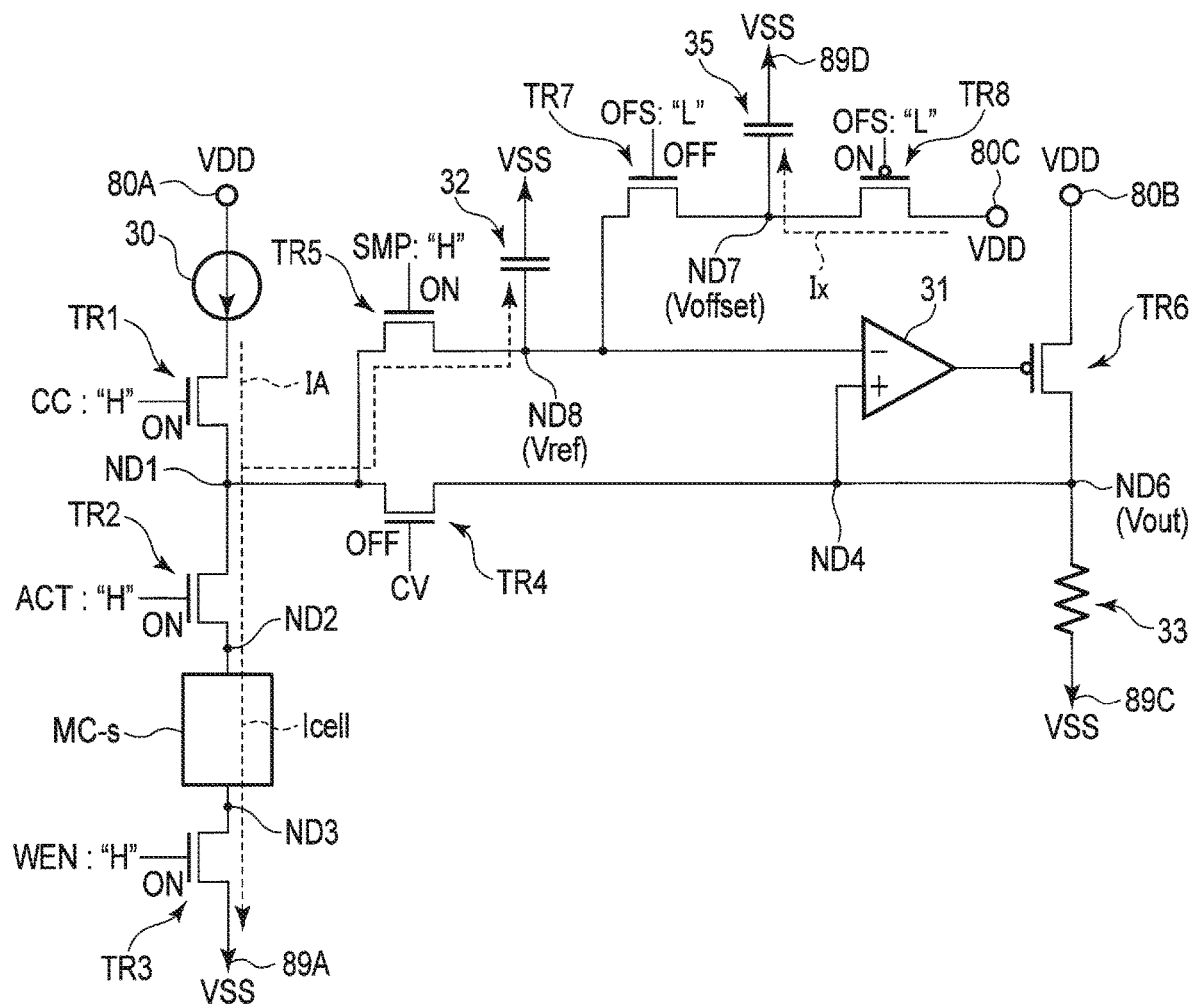
Figure 16:
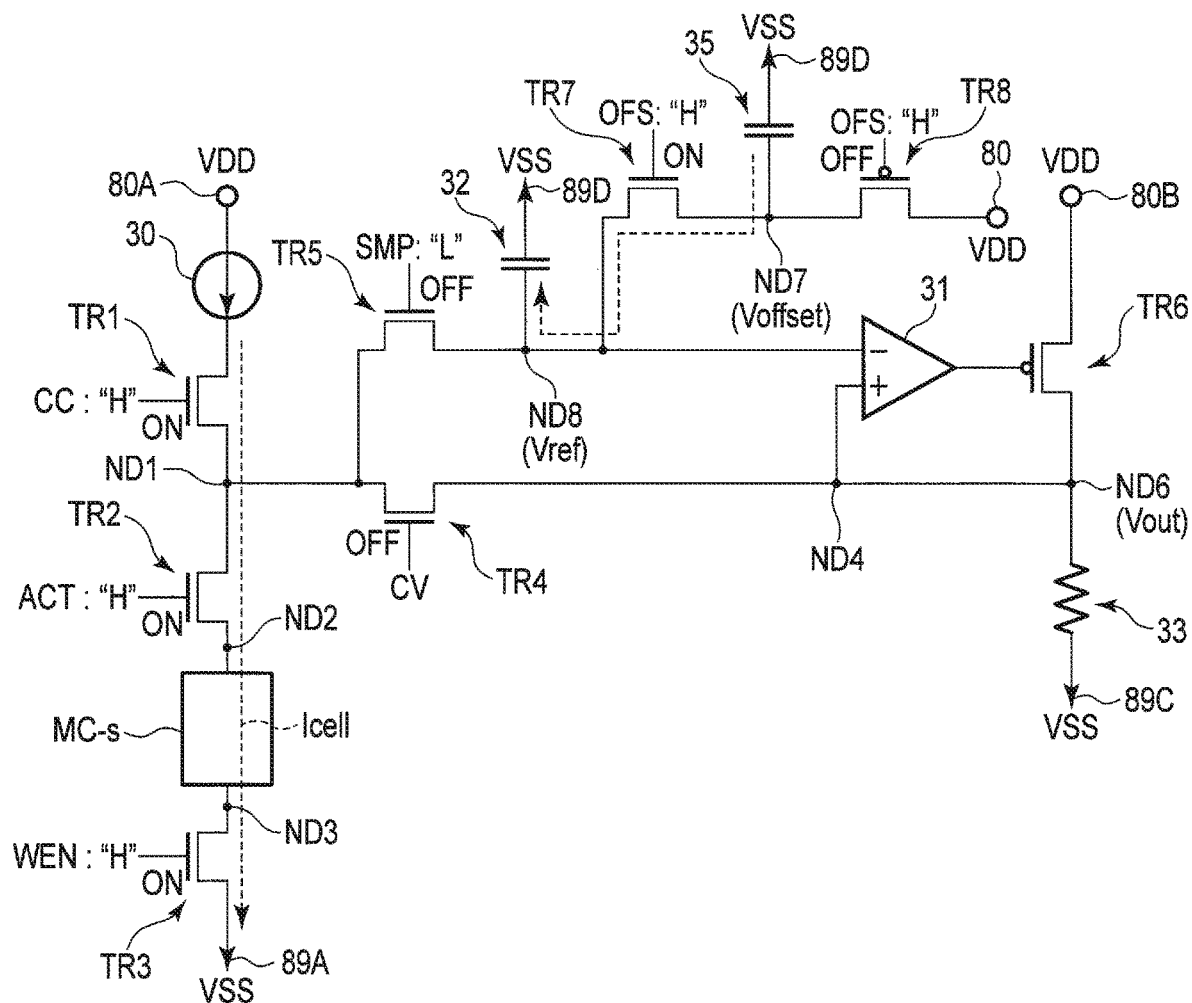

Referring to FIG. 15 to FIG. 17, an operation example of the MRAM of the present embodiment will be described.

FIG. 15 to FIG. 17 are views schematically illustrating the operation states of the write circuit (write driver circuit) at certain timings in the operation in the MRAM of the present embodiment.

Like the MRAM of the first embodiment, the MRAM of the present embodiment starts the write operation.

As illustrated in the above-described FIG. 9 and FIG. 10, the transistors TR1, TR2 and TR3 are set in the ON state in a predetermined order by the control signals CC, ACT and WEN of "H" level.

As illustrated in the above-described FIG. 10, at time instant t3 in FIG. 9, the transistor TR5 is set in the ON state. Thereby, the capacitance element 32 is charged by the current from the node ND1.

At this time, as illustrated in FIG. 15, the control circuit 190 sets the signal level of the control signal OFS to "L" level. By the signal OFS of "L" level, the N-type transistor TR7 is set in the OFF state. Therefore, the capacitance element 35 is electrically disconnected from the node ND6 (and node ND1) by the OFF-state transistor TR7.

By the signal OFS of "L" level, the P-type transistor TR8 is set in the ON state. Therefore, the capacitance element 35 is electrically connected to the power supply terminal 80C via the ON-state transistor TR8. The capacitance element 35 is charged by a current Ix from the power supply terminal 80C.

As a result, a potential Voffset of the node ND7 has a value corresponding to the charge potential of the capacitance element 35.

At time instant t4 in FIG. 9, the control circuit 190 changes the signal level of the control signal SMP from "H" level to "L" level. Thereby, the node ND8 is electrically disconnected from the node ND1 by the OFF-state transistor TR5.

As illustrated in FIG. 16, at a certain time instant (e.g. time instant t4) between time instant t3 and time instant t5, the control circuit 190 changes the signal level of the control signal OFS from "L" level to "H" level.

By the signal OFS of "H" level, the transistor TR8 is set in the OFF state. Thereby, the capacitance element 35 and node ND7 are electrically disconnected from the power supply terminal 80C by the OFF-state transistor TR8.

By the signal OFS of "H" level, the transistor TR7 is set in the ON state. Thereby, the capacitance element 35 is electrically connected to the capacitance element 32 via the ON-state transistor TR7.

Charge sharing occurs between the two electrically connected capacitance elements 32 and 35. Thereby, the charge potential of the capacitance element 32 may vary depending on the large/small relationship between the charge potentials of the two capacitance elements 32 and 35.

As a result, the potential of the node ND8 may vary in accordance with an increase or decrease of the charge potential of the capacitance element 32.

In this manner, the potential of the node ND8 is offset.

Thereafter, as illustrated in FIG. 17, the control circuit 190 changes the signal level of the control signal CV from "L" level to "H" level. Thereby, the amplifier 31 outputs an output signal Sout which corresponds to the potential difference between the node ND4 and the node ND8. The transistor TR6 passes a current Ib to the node ND6 by the driving power corresponding to the output signal Sout.

The potential of the node ND6 is set to be substantially equal to the potential of the node ND8.

In this manner, the cell current Icell is supplied to the selected cell MC-s by the write current from the voltage source circuit 310 of the write driver circuit 141.

Thereby, write data (e.g. write data associated with the AP state of the MTJ element 1) is written in the MTJ element 1 in the selected cell MC-s.

In the above-described manner, each of the control signals is set to "L" level at a predetermined timing.

As described above, the write operation (e.g. AP write) of the MRAM of the present embodiment is completed.

(c) Conclusion

In the MRAM of the present embodiment, an offset value is added to the charge potential of the capacitance element by the output from the constant current circuit.

Depending on the configurations of the MTJ element and memory cell array, there is a case where the pulse width (period T1) for the switching from the constant current source circuit to constant voltage source circuit cannot be set to preferable conditions (pulse width, time instant) with respect to the write error rate and the stabilization period of the potential as described with reference to FIG. 13.

For example, in the supply period T1 of the write pulse by the constant current source circuit 300, in order to realize a sufficiently low write probability, the current value of the write pulse is set to a relatively low value (e.g. a value lower than the magnetization switching threshold value of the MTJ element) such that the write probability may have a sufficiently low value.

In the period T1, the current value of the cell current flowing in the selected cell lowers.

As a result, at the time of AP write, in the period T1, there occurs substantially no change of the resistance state of the MTJ element from the low-resistance state to high-resistance state.

However, due to the lowering of the cell current, there is a possibility that the potential of the node ND1 (the potential of the selected cell) is not stabilized and the charge potential of the capacitance element, which is charged by the output of the current source circuit, lowers. If the charge potential of the capacitance element lowers, there is a possibility that the write error rate increases due to the deficiency of the current value when the write pulse is supplied by the voltage source circuit in the period T2.

In the MRAM of the present embodiment, the decrease of the charge potential is compensated by the offset voltage. Thereby, the potential of the node ND4 rises to a level which substantially equal to the cell potential for P write (or AP write). As a result, in the period T2, the cell current flowing in the selected cell has a current value which is not less than the magnetization switching threshold value.

Therefore, the MRAM of the present embodiment can achieve a relatively high write probability in the period T2.

In this manner, the MRAM of the present embodiment can ensure a degree of allowance in the switching time from the constant current source circuit to constant voltage source circuit.

As described above, the MRAM of the present embodiment can enhance the reliability of data write.

(3) Third Embodiment

Referring to FIG. 18, a memory device of a third embodiment will be described.

FIG. 18 is a view illustrating a configuration example of the memory device (e.g. MRAM) of the present embodiment.

As illustrated in FIG. 18, in the present embodiment, the write circuit 140 includes a monitor circuit 149.

The monitor circuit 149 is connected to a write driver circuit 141B. The monitor circuit 149 monitors the potential of the node ND1 in the write driver circuit 141B. Based on the monitored result of the potential of the node ND1, the monitor circuit 149 controls the signal level of the control signal SMP.

For example, after the start of the supply of current from the constant current source circuit 300 to the selected cell MC-s and capacitance element 32, the monitor circuit 149 detects that the potential of the node ND1 has reached a certain reference value (e.g. a value which ensures that the potential of the node ND1 is stabilized). Based on the detection result of the monitor circuit 149, the control circuit 190 changes the signal level of the control signal SMP from "H" level to "L" level at the timing of the detection of the reference value in the potential of the node ND1.

Thereby, the capacitance element 32 is electrically disconnected from the node ND1.

Note that the monitor circuit 149 may be connected to the write driver circuit 141A of FIG. 14, thereby to monitor the potential of the node ND1 of the write driver circuit 141A.

The monitor circuit 149 may be a circuit/function in the control circuit 190.

As described above, the memory device of the third embodiment can improve the characteristics of the memory device, like the first and second embodiments.

(4) Fourth Embodiment

Referring to FIG. 19 to FIG. 22, a memory device of a fourth embodiment will be described.

(a) Configuration Example

Figure 19:
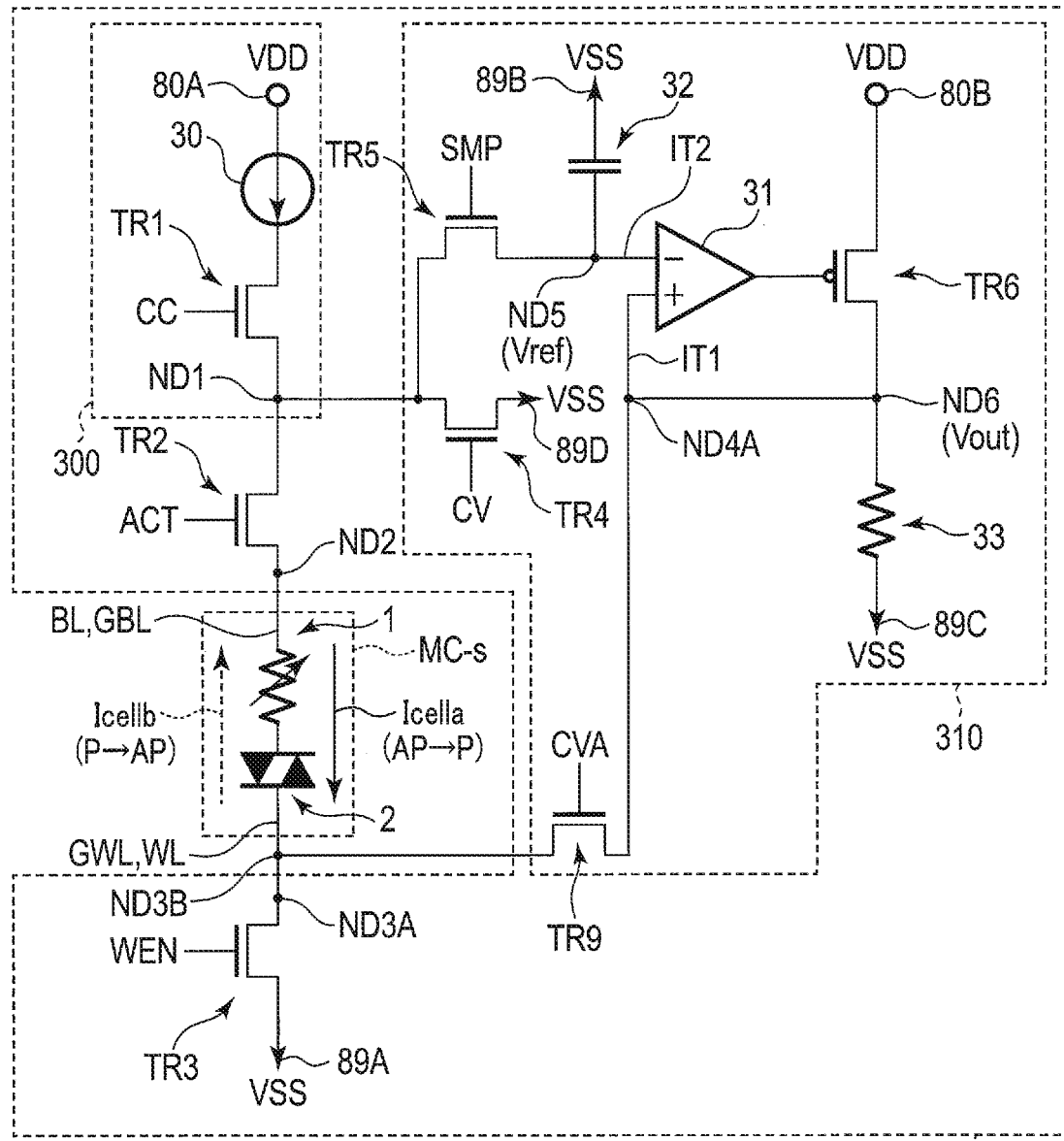
FIG. 19 is a view illustrating a configuration example of a memory device of a fourth embodiment.

Referring to FIG. 19, a configuration example of the memory device of the present embodiment will be described.

FIG. 19 is a view illustrating a configuration example of the memory device (e.g. MRAM) of the present embodiment.

As illustrated in FIG. 19, a terminal of a current path of a transistor TR2 is connected a memory cell MC via a node ND2, a global bit line GBL and a bit line BL.

One end of a current path of a transistor TR3 is connected to the memory cell MC via a node ND3A, a global word line GWL and a word line WL. The other end of the current path of the transistor TR3 is connected to a ground terminal 89A.

One end of a current path of a transistor TR4 is connected to the memory cell MC via the node ND2, global bit line GBL and bit line BL. The other end of the current path of the transistor TR4 is connected to a ground terminal 89D.

One input terminal (non-inversion input terminal) IT1 of an amplifier 31 is connected to a node ND4A. The node ND4A is connected to a node ND6.

One end of a current path of a transistor TR9 is connected to the input terminal IT1 of the amplifier 31 via the node ND4A. The other end of the current path of the transistor TR9 is connected to the selected cell via the global word line GWL and word line WL.

A control signal CVA is supplied to the gate of the transistor TR9. In accordance with the signal level of the control signal CVA, the ON/OFF of the transistor TR9 is controlled. A control signal CV for the transistor TR4 may be used as the control signal for the transistor TR9.

A capacitance element 32 is connected to the node ND2, global bit line GBL and bit line BL via the transistors TR2 and TR5.

In the MRAM of the present embodiment, at the time of the AP write operation, the current source circuit 300 is connected to the memory cell (selected cell) via the transistors TR1 and TR2, the global bit line GBL and bit line BL.

The current source 30 outputs a current Iz. The current Iz has a current value which is not less than the magnetization switching threshold value for AP write. Like the above-described embodiments, at the time of AP write to the selected cell, the capacitance element 32 is charged to a level that is substantially equal to the potential of the selected cell, by the current from the current source circuit 300.

In the MRAM of the present embodiment, at the time of AP write, a current Icella from the current source 30 flows to the selected cell in a direction (in this embodiment, a direction from the bit line BL toward the word line WL) for changing the magnetization alignment state of the MTJ element from the AP state to P state. Therefore, at the time of AP write, the magnetization alignment state of the MTJ element 1 that is in the P state does not change.

It should be noted, however, that the charge potential of the capacitance element 32 in this case is substantially equal to the charge potential in the case in which the write current of AP write (the current flowing from the word line WL toward the bit line BL) is passed through the MTJ element that is in the P state.

A write current Icellb is supplied to the selected cell by the output from the voltage source circuit 310, which corresponds to the charge potential of the capacitance element 32. The current Icellb flows to the selected cell in a direction (in this embodiment, a direction from the word line WL toward the bit line BL) for changing the magnetization alignment state of the MTJ element from the P state to AP state.

By this write current Icellb, the magnetization alignment state of the MTJ element 1 changes from the P state (low-resistance state) to the AP state (high-resistance state).

(b) Operation Example

Figure 20:
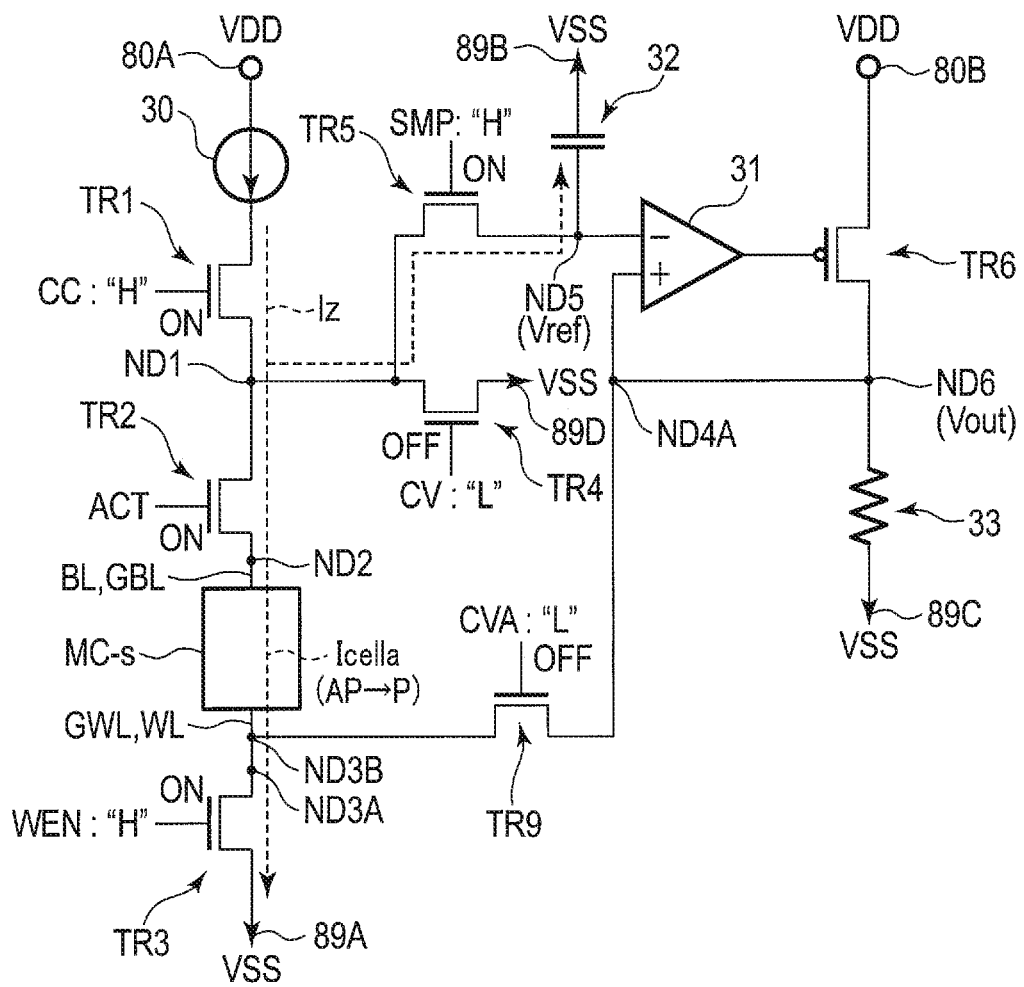

Referring to FIG. 20 to FIG. 22, an operation example of the MRAM of the present embodiment will be described.

FIG. 20 to FIG. 22 are views schematically illustrating the operation states of the write circuit (write driver circuit) at certain timings in the operation in the MRAM of the present embodiment.

As illustrated in FIG. 20, at the time of AP write, the transistors TR4 and TR9 are set in the OFF state. By the OFF-state transistor TR9, the input terminal IT1 of the amplifier 31 is electrically disconnected from the selected cell.

At the time of AP write, the transistors TR1, TR2 and TR3 are set in the ON state. The current source circuit 300 is electrically connected to the selected cell via the ON-state transistors TR1, TR2 and TR3.

A cell current Icella, which corresponds to the current from the current source 30, flows in the selected cell MC-s. In addition, the current from the current source circuit 300 is supplied to the capacitance element 32 via the node ND1 and transistors TR1 and TR5.

In the present embodiment, the current Icella flows in the direction from the bit line BL toward the word line WL. In this embodiment, the direction in which the current Icella flows corresponds to the direction for changing the magnetization alignment state of the MTJ element 1 from the AP state to P state.

At the time of AP write, the magnetization alignment state of the MTJ element 1 is the P state. Therefore, even when the current in the direction for changing the magnetization alignment state of the MTJ element 1 to the P state flows in the MTJ element 1 that is in the P state, the magnetization alignment state (resistance state) of the MTJ element 1 does not change.

The current value of the current flowing in the MTJ element 1 that is in the P state is the current value of the current from the current source for the AP write.

Therefore, the charge potential of the capacitance element 32 in the case of FIG. 20 is equal to the charge potential of the capacitance element in the case where the current flowing in the direction for changing the magnetization alignment state of the MTJ element 1 from the P state to AP state is supplied from the current source 30 for AP write to the MTJ element 1 that is in the P state. In this manner, in the present embodiment, the cell potential of the selected cell including the MTJ element that is in the P state is sampled by the capacitance element 32 by using the write current (cell current) Icella which flows in the direction for changing the magnetization alignment of the MTJ element 1 to the P state.

As illustrated in FIG. 21, the transistor TR5 is set in the OFF state at a timing (e.g. time instant t4 in FIG. 9) at which the potential of the node ND1 is stabilized. Thereby, the capacitance element 32 is electrically disconnected from the selected cell MC-s.

As illustrated in FIG. 22, the transistors TR1, TR2 and TR3 are set in the OFF state. Thereby, the current source 30 is electrically disconnected from the selected cell MC-s.

The control circuit 190 changes the signal level of the signal CVA from "L" level to "H" level. The signal CVA of "H" level is supplied to the gate of the transistor TR9. Thereby, the transistor TR9 is set in the ON state.

Thereby, a current Iy from the voltage source circuit 310 is supplied to the selected cell MC-s.

The current Icellb flows in the MTJ element 1. The current Icellb flows in the direction from the word line WL toward the bit line BL. In the present embodiment, the direction in which the current Icellb flows corresponds to the direction for changing the magnetization alignment state of the MTJ element 1 from the P state to AP state.

Thereby, the magnetization alignment state of the MTJ element 1 changes from the P state to AP state.

The current Icellb is supplied to the ground terminal 89D via the ON-state transistor TR4.

After the write current is supplied to the selected cell during a predetermined period, the transistors TR4 and TR9 are set in the OFF state. The voltage source circuit 310 is electrically disconnected from the selected cell MC-s.

By the above-described operation, the data associated with the AP state of the MTJ element is written in the selected cell MC-s.

As described above, the write operation (AP write) of the MRAM of the present embodiment is completed.

Note that in the MRAM of the present embodiment, P write may be executed by using the current source circuit 300. In the current source circuit 300, a current source (not shown) for P write may be provided separately from the current source 30 for AP write. For example, the current value of an output current of the current source for P write is less than the current value of the output current of the current source 30 for AP write.

(c) Conclusion

In the memory device of the present embodiment, at the time of charging the capacitance element, the current from the current source circuit 300 flows in the direction for changing the magnetization alignment state of the MTJ element from the AP state to P state.

Therefore, in the present embodiment, when the current from the current source is supplied in the AP write, the magnetization alignment state of the MTJ element that is in the P state does not change.

As a result, in the memory device of the present embodiment, when the current from the current source (constant current source) is supplied, no breakdown of the MTJ element occurs.

Therefore, the memory device of this embodiment can enhance the reliability.

(5) Modifications

Modifications of the memory devices of the embodiments will be described with reference to FIG. 23 and FIG. 24.

Figure 23:
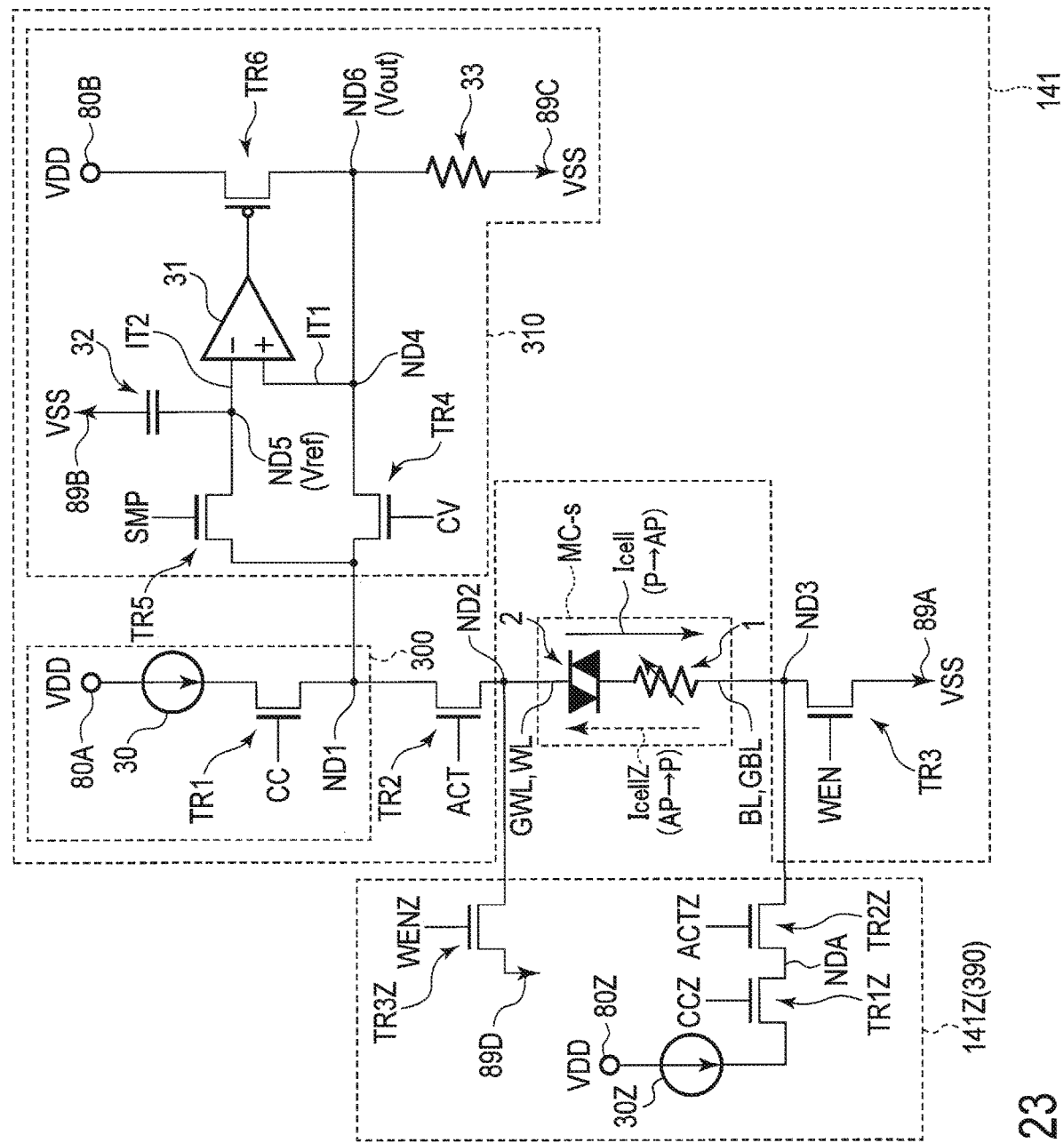

FIG. 23 is a schematic view illustrating a modification of the memory devices of the embodiments.

As illustrated in FIG. 23, the memory device (e.g. MRAM) of the present modification includes a write driver circuit 141 for AP write and a write driver circuit 141Z for P write.

In this modification, the internal configuration of the write driver circuit 141Z for P write differs from the internal configuration of the write driver circuit 141 for AP write.

The write driver circuit 141 supplies a write pulse to the memory cell at the time of the write operation for changing the magnetization alignment state of the MTJ element 1 from the P state to AP state.

The write driver circuit 141Z supplies a write pulse to the memory cell at the time of the write operation for changing the magnetization alignment state of the MTJ element from the AP state to P state.

At the time of the write operation for changing the magnetization alignment state of the MTJ element 1 from the AP state to P state, the possibility that a large voltage is applied to the memory cell when write current is supplied is lower than the write operation for changing the magnetization alignment state of the MTJ element 1 from the P state to AP state.

Therefore, the write driver circuit 141Z may be a circuit which includes only a constant current source circuit 390.

The write driver circuit 141Z includes a current source 30Z, and transistors TR1Z, TR2Z and TR3Z.

One end of the current source 30Z is connected to a power supply terminal 80Z. The other end of the current source 30Z is connected to a node NDA.

One end of a current path of the N-type transistor TR1Z is connected to the other end of the current source 30Z. The other end of the current path of the transistor TR1Z is connected to the node NDA. A control signal CCZ is supplied to the gate of the transistor TR1Z.

One end of a current path of the N-type transistor TR2Z is connected to the node NDA. The other end of the current path of the transistor TR2Z is connected to the global bit line GBL and bit line BL via a node ND3. A control signal ACTZ is supplied to the gate of the transistor TR2Z.

One end of a current path of the N-type transistor TR3Z is connected to the global word line GWL and word line WL via a node ND2. The other end of the current path of the transistor TR3Z is connected to a ground terminal 89D. A control signal (write enable signal) WENZ is supplied to the gate of the transistor TR3Z.

The node ND3 serves as a source-side terminal of current with respect to the write driver circuit 141. The node ND2 serves as a sink-side terminal with respect to the write driver circuit 141.

When executing the P write, the control circuit 190 changes the signal levels of the control signals CCZ, ACTZ and WENZ from "L" level to "H" level, substantially at the same timings as the time instants t1, t2 and t3 in FIG. 7.

Thereby, a cell current IcellZ for P write flows in the direction from the bit line BL toward the word line WL.

At the time of P write using the write driver circuit 141, 141A of FIG. 7 or FIG. 14, the write current (cell current) may be supplied to the selected cell MC-s by only the constant current source circuit 300, without the supply of current from the constant voltage circuit 310 (i.e. without the driving of the circuit 310). It should be noted, however, that in the P write using the write driver circuit 141, 141A of FIG. 7 or FIG. 14, the direction in which the write current for P write flows is opposite to the direction in which the write current for AP write flows. Thus, in FIG. 7 or FIG. 14, at the time of P write, the constant current source circuit 300 is connected to the global bit line GBL (and bit line BL), and the transistor TR3 is connected to the global word line GWL (and word line WL).

Like the above-described embodiments, the memory device of the present modification can improve the characteristics of the memory device.

FIG. 24 is a schematic view illustrating another modification of the memory devices (e.g. MRAM) of the embodiments.

As illustrated in FIG. 24, in the write driver circuit 141, the timing (time instant t5A) of starting the supply of current from the voltage source circuit 310 may be after the timing (time instant t6) of the stop of supply of current from the current source circuit 300.

In this case, a predetermined period T3 is provided between a supply period T1 of current from the current source circuit 300 and a supply period T2 of current from the voltage source circuit 310. For example, the current value of the write current (cell current Icell) decreases to a desired current value or less in a predetermined period.

In this case, too, like the above-described embodiments, the memory device of the present modification can improve the characteristics of the memory device.

(6) Others

In the memory devices of the embodiments, a magnetoresistive effect element of an in-plane magnetization type may be used for the memory element. In the in-plane magnetization-type magnetoresistive effect element (e.g. MTJ element), each magnetic layer has an in-plane magnetic anisotropy. The direction of the easy magnetization axis of each magnetic layer is parallel to the layer surface of the magnetic layer. Each magnetic layer has magnetization parallel to the layer surface. The direction of magnetization of each magnetic layer is perpendicular to the direction of arrangement of magnetic layers.

In the memory devices of the embodiments, the configurations of the memory cell and memory cell array are not limited to the examples of FIG. 2 to FIG. 4. For example, in the memory devices of the embodiments, a memory cell including a field-effect transistor may be used. The field-effect transistor (hereinafter referred to as "cell transistor") functions as a switching element of the memory cell. The memory cell is connected to two bit lines, which constitute a bit line pair, and to a word line. One end of the current path of the cell transistor is connected to a first bit line, and the other end of the current path of the cell transistor is connected to one end of the magnetoresistive effect element. The other end of the magnetoresistive effect element is connected to a second bit line (source line). The gate of the cell transistor is connected to the word line.

The memory device of each of the embodiments may be a PCM/PCRAM (phase-change memory), or ReRAM (resistance-change memory).

In the embodiments, the meaning of the term "connection" may include, as appropriate, not only the case in which two constituent elements are directly connected with no other element being interposed, but also the case in which two constituent elements are indirectly connected with another element being interposed, depending on the relationship between the constituent elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first interconnect;
a second interconnect;
a memory cell including a variable resistive element, the memory cell being electrically connected between the first interconnect and the second interconnect; and
a write circuit including a first current source circuit and a voltage source circuit, the write circuit being configured to write data to the memory cell by using a write pulse,
wherein the write circuit is configured to:
supply the write pulse to the memory cell by using the first current source circuit in a first period from a first time of a start of a supply of the write pulse to a second time, and
supply the write pulse to the memory cell by using the voltage source circuit in a second period from a third time to a fourth time of an end of the supply of the write pulse.

2. The memory device according to claim 1, wherein the write circuit includes:
a first transistor electrically connected between a current source and a first node;
a second transistor electrically connected between the first node and the memory cell;
a third transistor electrically connected between the first node and a second node;
a first capacitance element electrically connected to the second node;
a fourth transistor electrically connected between the first node and a third node;
an amplifier including a first input terminal electrically connected to the second node, a second input terminal electrically connected to the third node, and an output terminal;
a fifth transistor including a gate electrically connected to the output terminal, and including one end of a current path, the one end being electrically connected to the third node; and a resistance element electrically connected to the third node.

3. The memory device according to claim 2, wherein:
the first current source is electrically connected to the first node via the first transistor which is in an ON state,
the write pulse based on an output current of the first current source is supplied to the memory cell via the first and second transistors which are in the ON state, and the first capacitance element is electrically connected to the first node via the third transistor which is in the ON state,
the amplifier outputs, after the third transistor is set in an OFF state, a first signal, which is based on a potential difference between the second node and the third node, to the gate of the fifth transistor from the output terminal, and
the write pulse based on an output current of the fifth transistor is supplied to the memory cell via the fourth transistor.

4. The memory device according to claim 3, further comprising:
a sixth transistor electrically connected between the second node and a fourth node;
a seventh transistor electrically connected between the fourth node and a voltage terminal; and
a second capacitance element electrically connected to the fourth node,
wherein:
in the first period, the second capacitance element is electrically disconnected from the second node by the sixth transistor which is in the OFF state, and the second capacitance element is charged by the voltage terminal via the seventh transistor which is in the ON state, and
the second capacitance element is, before the amplifier outputs the first signal, electrically connected to the first capacitance element via the sixth transistor which is in the ON state.

5. The memory device according to claim 4, wherein in the second period, the second capacitance element is electrically connected to the first capacitance element.

6. The memory device according to claim 2, wherein the write circuit further includes a monitor circuit configured to monitor a potential of the first node.

7. The memory device according to claim 6, wherein the write circuit controls the ON state and the OFF state of the third transistor based on a result of monitoring the potential of the first node by the monitor circuit.

8. The memory device according to claim 1, wherein the third time coincides with the second time.

9. The memory device according to claim 1, wherein the third time is a time between the first time and the second time.

10. The memory device according to claim 1, wherein the third time is a time after the second time.

11. The memory device according to claim 1, wherein the write pulse flows, in the first period, in the variable resistive element in a direction for changing a resistance state of the variable resistive element from a high-resistance state to a low-resistance state, and the write pulse flows, in the second period, in the variable resistive element in a direction for changing the resistance state of the variable resistive element from the low-resistance state to the high-resistance state.

12. The memory device according to claim 1, wherein the write circuit includes:
a first transistor electrically connected between a current source and a first node;
a second transistor electrically connected between the first node and a first terminal of the memory cell;
a third transistor electrically connected between the first node and a second node;
a first capacitance element electrically connected to the second node;
a fourth transistor electrically connected between a second terminal of the memory cell and a third node;
an amplifier including a first input terminal electrically connected to the second node, a second input terminal electrically connected to the third node, and an output terminal;
a fifth transistor including a gate electrically connected to the output terminal, and including one end of a current path, the one end being electrically connected to the third node; and
a resistance element electrically connected to the third node.

13. The memory device according to claim 12, wherein, in the first period:
the first current source is electrically connected to the first node via the first transistor which is in an ON state,
the write pulse based on an output current of the first current source is supplied to the first terminal of the memory cell via the first and second transistors which are in the ON state, and the first capacitance element is electrically connected to the first node via the third transistor which is in the ON state,
the amplifier outputs, after the third transistor is set in an OFF state, a first signal, which is based on a potential difference between the second node and the third node, to the gate of the fifth transistor from the output terminal, and
the write pulse based on an output current of the fifth transistor is supplied to the second terminal of the memory cell via the fourth transistor.

14. The memory device according to claim 1, wherein:
the write circuit further includes a second current source circuit,
the write circuit uses the first current source circuit and the voltage source circuit when changing the resistance state of the variable resistive element from the low-resistance state to the high-resistance state, and
the write circuit uses the second current source circuit when changing a resistance state of the variable resistive element from a high-resistance state to a low-resistance state.

15. The memory device according to claim 14, wherein:
the first current source circuit and the voltage source circuit are electrically connected to the first interconnect, and
the second current source circuit is electrically connected to the second interconnect.

16. The memory device according to claim 1, wherein:
the variable resistive element comprises a magnetoresistive effect element, and
the write pulse changes a resistance state of the magnetoresistive effect element from a low-resistance state to a high-resistance state.

17. A memory device comprising:
a first interconnect;
a second interconnect;
a memory cell including a variable resistive element, the memory cell being electrically connected between the first interconnect and the second interconnect; and
a write circuit including a first current source circuit and a voltage source circuit, a first transistor electrically connected between a current source and a first node; a second transistor electrically connected between the first node and the memory cell; a third transistor electrically connected between the first node and a second node; a first capacitance element electrically connected between the second node and a voltage terminal; a fourth transistor electrically connected between the first node and a third node; an amplifier including a first input terminal electrically connected to the second node, a second input terminal electrically connected to the third node, and an output terminal; a fifth transistor including a gate electrically connected to the output terminal, and including one end of a current path, the one end being electrically connected to the third node; and a resistance element electrically connected to the third node.

18. A memory device comprising:
a first interconnect;
a second interconnect;
a memory cell including a variable resistive element, the memory cell being electrically connected between the first interconnect and the second interconnect; and
a write circuit including a first current source circuit and a voltage source circuit, a first transistor electrically connected between a current source and a first node; a second transistor electrically connected between the first node and a first terminal of the memory cell; a third transistor electrically connected between the first node and a second node; a first capacitance element electrically connected between the second node and a voltage terminal; a fourth transistor electrically connected between a second terminal of the memory cell and a third node; an amplifier including a first input terminal electrically connected to the second node, a second input terminal electrically connected to the third node, and an output terminal; a fifth transistor including a gate electrically connected to the output terminal, and including one end of a current path, the one end being electrically connected to the third node; and a resistance element electrically connected to the third node.

* * * * *